United States Patent [19]
Lipton

[11] Patent Number: 6,009,252
[45] Date of Patent: Dec. 28, 1999

[54] METHODS, APPARATUS AND COMPUTER PROGRAM PRODUCTS FOR DETERMINING EQUIVALENCIES BETWEEN INTEGRATED CIRCUIT SCHEMATICS AND LAYOUTS USING COLOR SYMMETRIZING MATRICES

[75] Inventor: Gary Bruce Lipton, Durham, N.C.

[73] Assignee: Avant! Corporation, Fremont, Calif.

[21] Appl. No.: 09/035,271

[22] Filed: Mar. 5, 1998

[51] Int. Cl.$^6$ .............................. G06F 17/16; G06F 17/00; G06F 15/00

[52] U.S. Cl. ................................ 395/500.06; 395/500.05; 395/500.02

[58] Field of Search .................................. 364/488, 489, 364/490, 491; 395/500.05, 500.06, 500.07

[56] References Cited

U.S. PATENT DOCUMENTS

| | | | |
|---|---|---|---|
| 5,095,454 | 3/1992 | Huang ..................................... | 364/578 |
| 5,243,538 | 9/1993 | Okuzawa et al. ....................... | 364/489 |
| 5,249,133 | 9/1993 | Batra ....................................... | 364/489 |
| 5,249,134 | 9/1993 | Oka ......................................... | 364/491 |
| 5,281,558 | 1/1994 | Bamji et al. ............................. | 437/250 |
| 5,301,318 | 4/1994 | Mittal ..................................... | 395/600 |

(List continued on next page.)

OTHER PUBLICATIONS

Batra and Cooke "HCompare: A Hierarchical Netlist Comparison Program," 29th ACM/IEEE Design Automation Conference, Jun. 8–12, 1992, pp. 299–304.

Kim and Shim "Hierarchical LVS Based on Hierarchy Rebuilding," Proceedings of the ASP–DAC '98, Asia and South Pacific Design Automation Conference, Feb. 10–13, 1998, pp. 379–384.

Pelz and Roettcher "Circuit Comparison by Hierarchical Pattern Matching," 1991 IEEE International Conference on Computer–Aided Design, Nov. 11–14, 1991, pp. 290–293.

Ebeling "Geminill: A Second Generation Layout Validation Program," IEEE International Conference on Computer–Aided Design, Nov. 7–10, 1988, pp. 322–325.

Saber and Tekalp "Face Detection and Facial Feature Extraction Using Color, Shape and symmetry–Based Cost Functions," Proceedings of the 13th International Conference on Pattern Recognition, Aug. 25–29, 1996, pp. 654–658, vol. 3.

(List continued on next page.)

Primary Examiner—Kevin J. Teska
Assistant Examiner—Marcel Pruessner
Attorney, Agent, or Firm—Myers Bigel Sibley & Sajovec

[57] ABSTRACT

A layout versus schematic (LVS) comparison tool determines one-to-one equivalency between an integrated circuit schematic and an integrated circuit layout by performing operations to generate color symmetrizing matrices corresponding to respective child cells in the integrated circuit schematic. Here, the child cells are characterized as having a number of symmetrical configurations which at a port level are electrically equivalent. Operations are also performed to generate a first color symmetry vector for a child cell in the integrated circuit schematic and a second color symmetry vector for the corresponding child cell in the integrated circuit layout. A vector equivalency is also preferably determined by comparing a product of the color symmetrizing matrix and the first color symmetry vector against a product of the color symmetrizing matrix and the second color symmetry vector. Notwithstanding the presence of a vector equivalency, a possibility may still exist that with respect to the corresponding symmetric child cells in the schematic and layout, isomorphism between the schematic and layout is not present. To address this possibility, an operation is preferably performed to detect the absence of a spurious symmetry in the color symmetrizing matrix. If an absence is detected, the presence of the vector equivalency will unequivocally establish the one-to-one correspondence with respect to the child cells being analyzed. Thus, the need to perform a computationally expensive membership test to determine whether a selected permutation can be derived from valid symmetries, can be successfully eliminated. The preferred comparison tool also infers symmetries, where available, so that symmetries of a child cell may be propagated to a parent cell when the tool is evaluating a grandparent cell containing the parent cell.

33 Claims, 12 Drawing Sheets

U.S. PATENT DOCUMENTS

| | | | |
|---|---|---|---|
| 5,349,659 | 9/1994 | Do et al. | 395/700 |
| 5,455,928 | 10/1995 | Herlitz | 395/500 |
| 5,461,576 | 10/1995 | Tsay et al. | 364/490 |
| 5,463,561 | 10/1995 | Razdan | 364/489 |
| 5,469,366 | 11/1995 | Yang et al. | 364/489 |
| 5,475,605 | 12/1995 | Lin | 364/488 |
| 5,475,695 | 12/1995 | Caywood et al. | 371/27 |
| 5,490,095 | 2/1996 | Shimada et al. | 364/578 |
| 5,497,334 | 3/1996 | Russell et al. | 364/489 |
| 5,513,313 | 4/1996 | Bruck | 395/182.02 |
| 5,528,508 | 6/1996 | Russell et al. | 364/488 |
| 5,541,849 | 7/1996 | Rostoker et al. | 364/489 |
| 5,548,524 | 8/1996 | Hernandez et al. | 364/489 |
| 5,550,750 | 8/1996 | Wolff | 364/491 |
| 5,555,201 | 9/1996 | Dangelo | 364/489 |
| 5,559,718 | 9/1996 | Baisuck et al. | 364/491 |
| 5,568,396 | 10/1996 | Bamji et al. | 364/491 |
| 5,574,388 | 11/1996 | Barbier et al. | 326/41 |
| 5,581,474 | 12/1996 | Bamji et al. | 364/490 |
| 5,590,049 | 12/1996 | Arora | 364/489 |
| 5,592,392 | 1/1997 | Matheson et al. | 364/490 |
| 5,604,680 | 2/1997 | Bamji et al. | 364/491 |
| 5,606,698 | 2/1997 | Powell | 395/709 |
| 5,610,832 | 3/1997 | Wikle et al. | 364/491 |
| 5,623,419 | 4/1997 | Kundert | 364/490 |
| 5,625,564 | 4/1997 | Rogoyski | 364/488 |
| 5,625,565 | 4/1997 | Van Dyke | 364/489 |
| 5,634,115 | 5/1997 | Fitzpatrick et al. | 395/500 |
| 5,636,132 | 6/1997 | Kamdar | 364/491 |
| 5,648,910 | 7/1997 | Ito | 364/490 |
| 5,649,166 | 7/1997 | Saldanha et al. | 395/500 |
| 5,689,432 | 11/1997 | Blaauw et al. | 364/490 |
| 5,691,910 | 11/1997 | Thodiyil | 364/483 |
| 5,694,481 | 12/1997 | Lam et al. | 382/145 |
| 5,801,958 | 9/1998 | Dangelo et al. | 364/489 |
| 5,903,469 | 5/1999 | Ho | 364/489 |

OTHER PUBLICATIONS

Abadir and Ferguson "An Improved Layout Verification Algorithm (LAVA)," Proceedings of the European Design Automation Conference, Mar. 12–15, 1990, pp. 391–395.

A.J. van Genderen and N.P. van der Meijs, *Hierarchical Extraction of 3D Interconnect Capacitances in Large Regular VLSI Structures*, Delft University of Technology, Department of Electrical Engineering, Mekelweg 4, 2628 CD Delft, The Netherlands.

Riedell et al., *Dielectric Characterization of Printed Circuit Substrates*, Conference Proceedings—IEEE Southeastcon '89, Proceedings, vol. 1 of 3, Apr. 9–12, 1989, Conference and Exhibit, pp. 102–106.

K.W. Chiang et al., *Time–Efficient VLSI Artwork Analysis Algorithms in GOALIE2*, IEEE Transactions on Computer–Aided Design, vol. 8 No. 6, Jun. 1989, pp. 640–648.

Riedell et al., *Dielectric Characterization of Printed Circuit Board Substates*, IEEE Transactions on Instrumentation and Measurement, vol. 39, No. 2, Apr. 1990, pp. 437–440.

K.P. Belkhale et al., *Parallel Algorithms for VLSI Circuit Extraction*, IEEE Transactions on Computer–Aided Design, vol. 10, No. 5, May 1991, pp. 604–618.

Basel et al., *High Speed Digital System Simulation Using Frequency Dependent Transmission Line Network Modeling*, IEEE MTT–S International Microwave Symposium Digest, vol. 3, 1991 IEEE, pp. 987–990.

Franzon et al., *Tools to Aid in Wiring Rule Generation for High Speed Interconnects*, Proceedings—Design Automation Conference, 29$^{th}$ ACM/IEEE Design Automation Conference, 1992 IEEE, pp. 466–471.

Deschacht et al., *Post–Layout Timing Simulation of CMOS Circuits*, IEEE, vol. 12, No. 8, Aug. 1993, pp. 1170–1177.

Basel et al., *Hierarchical Simulation of High Speed Digital Interconnects using a Packaging Simulator*, 1994 Proceedings, 44$^{th}$ Electronic Components & Tech. Conference, May 1–4, 1994, IEEE, pp. 81–87.

Ramachandran et al., *Combined Topological and Functionality–Based Delay Estimation Using a Layout–Driven Approach for High–Level Applications*, IEEE, vol. 13, No. 12, Dec., 1994, pp. 1450–1460.

Basel et al., *Simulation of High Speed Interconnects Using a Convolution–Based Hierarchical Packaging Simulator*, IEEE Transactions on Components, Packaging, and Manufacturing Technology, Part B, vol. 18, No. 1, Feb. 1995, pp. 74–82.

Onozawa et al., *Post–Layout Optimization of Power and Timing for ECL LSIs*, IEEE, Mar. 6–9, 1995, pp. 167–172.

Choudhury et al., *Automatic Generation of Analytical Models for Interconnect Capacitances*, IEEE Transactions on Computer–Aided Design of Integrated Circuits and Systems, vol. 14, No. 4, Apr. 1995, pp. 470–480.

Wang et al., *Accurate Parasitic Resistance Extraction for Interconnection Analysis*, Proceedings of the IEEE 1995 Custom Integrated Circuits Conference, May 1–4, 1995, 12.2.1–12.2.4, pp. 255–258.

J. Lipman, *Submicron EDA to Help Tackle Tough Designs*, EDN, Jun. 8, 1995, pp. 44–51.

S.E. Schulz, *Timing Analysis Tools and Trends*, Focus Report, Integrated System Design, Nov. 1995, pp. 50–57.

Basel, *Accurate and Efficient Extraction of Interconnect Circuits for Full–Chip Timing Analysis*, Wescon Conference Record 1995, Moscone Convention Center, San Francisco, CA, Nov. 7–9, 1995, pp. 118–123.

N.D. Arora et al., *Modeling and Extraction of Interconnect Capacitances for Multilayer VLSI Circuits*, IEEE Transactions on Computer–Aided Design of Integrated Circuits and Systems, vol. 15, No. 1, Jan. 1996, pp. 58–67.

Navabi et al., *Modeling Strategy for Post Layout Verification*, IEEE, pp. P5–7.1–P5–7.4.

IC Design Automation, An Electronics Journal; Feb. 1997, pp. 1–12.

Electronics Journal, IC Design Automation; Feb. 1998.

Avant! Corporation of Sunnyvale, California, Chapter 11 Netlist Comparison Commands, Section 11.2 Compare Command, Hercules™ Reference Manual, vol. II, Jan. 1997, pp. 11–15–11–44, R–1–R–12.

Avant! Corporation of Sunnyvale, California, Chapter 11 Netlist Comparison Commands, Section 11.2 Compare Command, Hercules™ Reference Manual, vol. II, May 1997, pp. 11–15–11–44, Q–1–Q–4, R–1–R–16.

Pelz and Roettcher "Pattern Matching and Refinement Hybrid Approach to Circuit Comparison," IEEE Transactions on Computer–Aided Design of Integrated Circuits and Systems, vol. 13, No. 2, Feb. 1994, pp. 264–276.

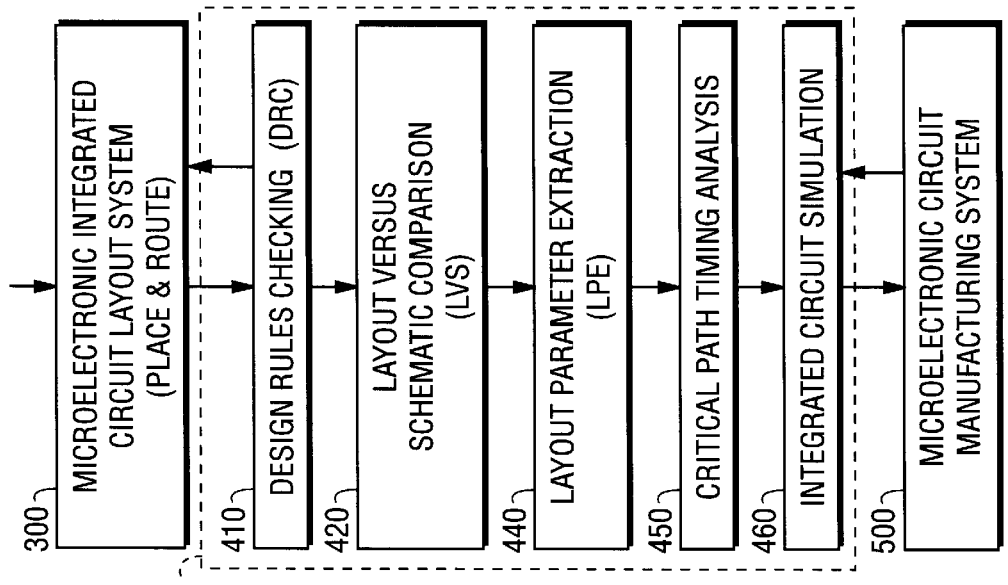
FIG. 7
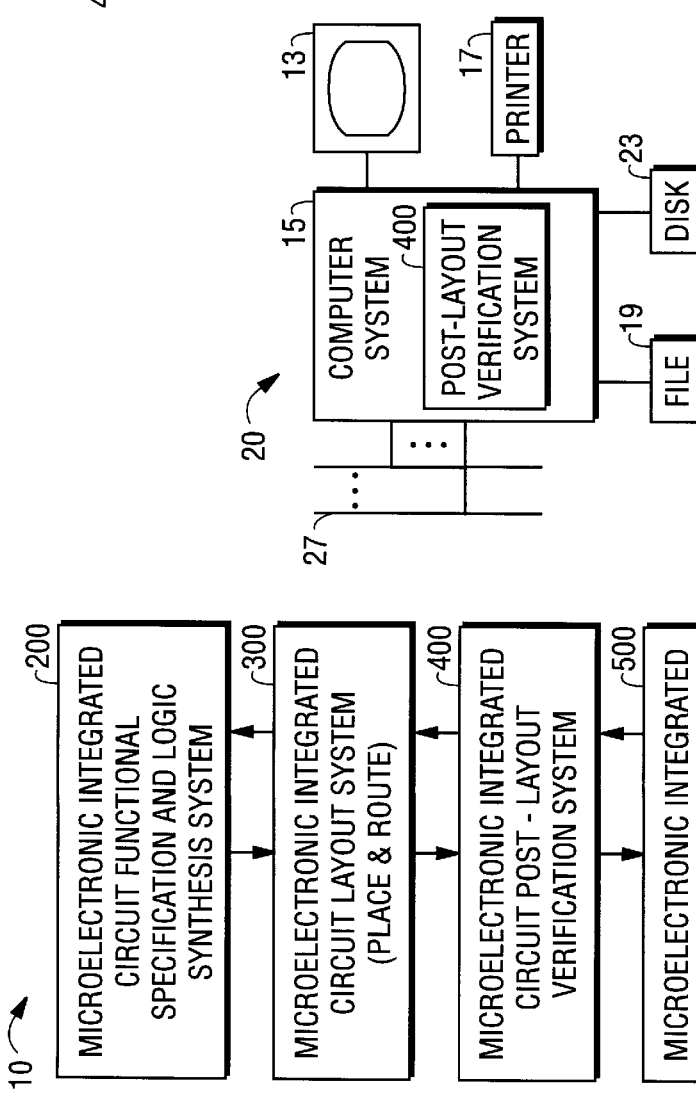
FIG. 6
FIG. 5

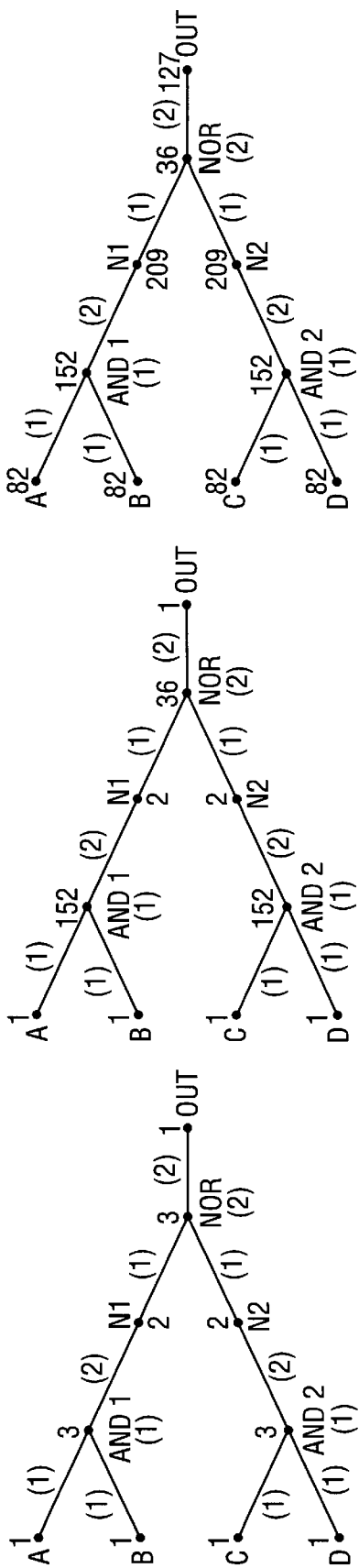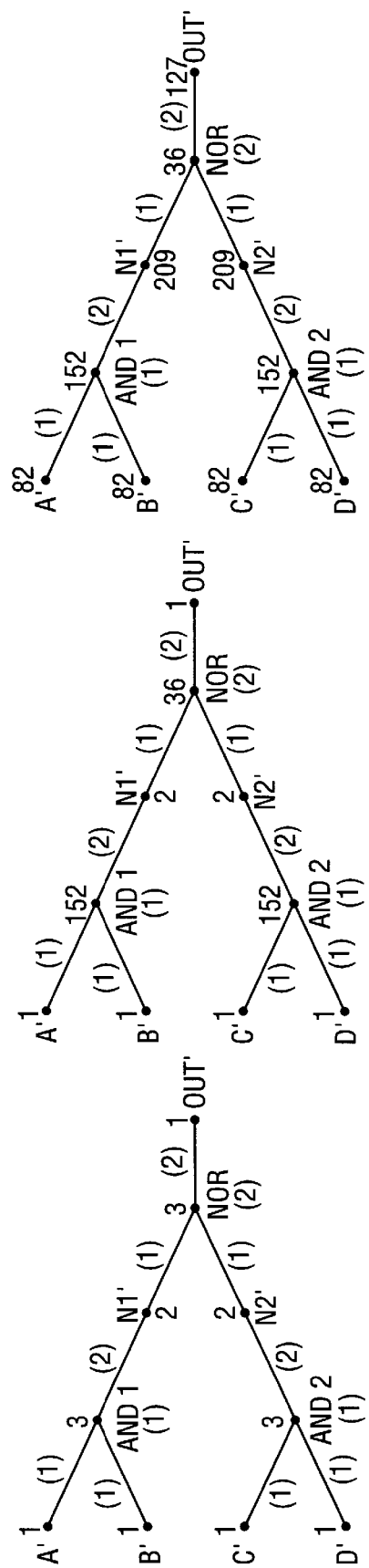

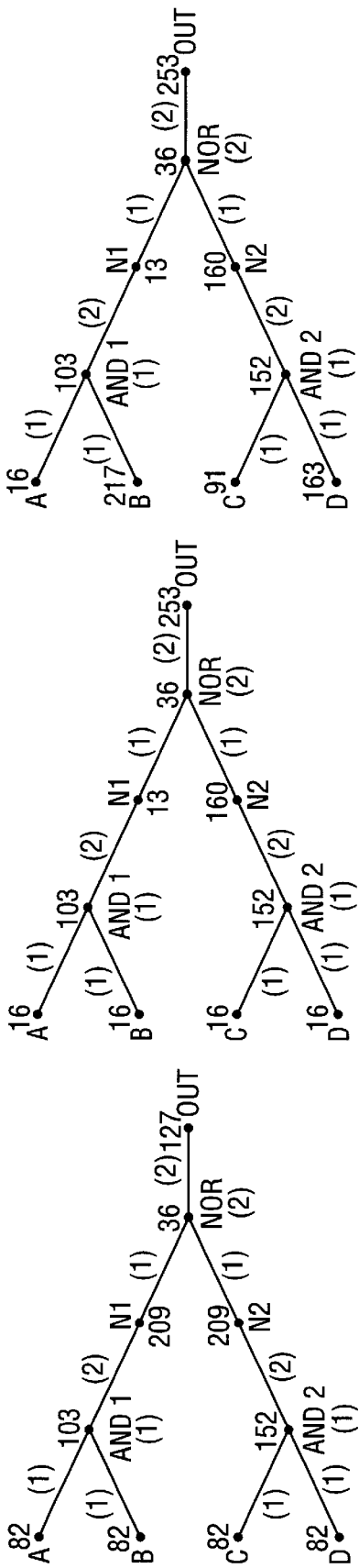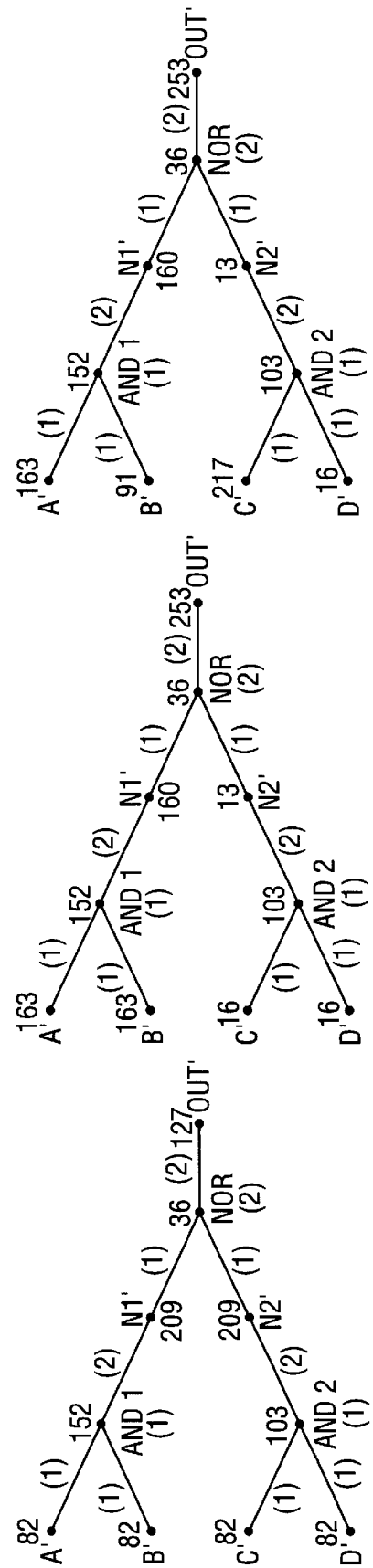

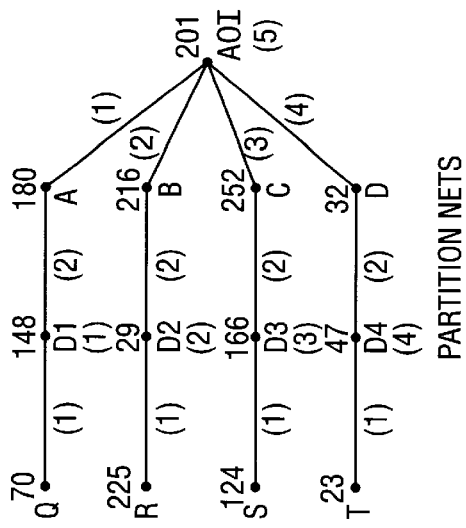
FIG. 15A (SCHEMATIC) INITIALIZE
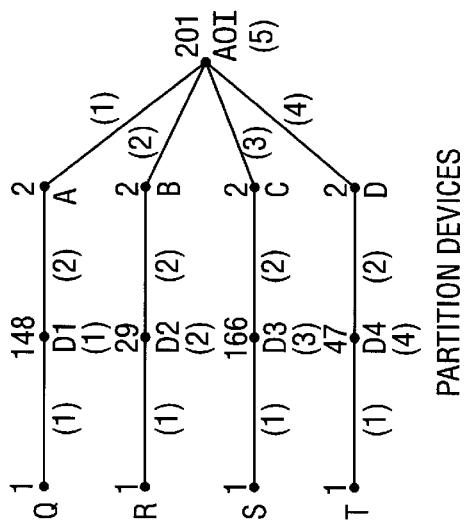
FIG. 15B (SCHEMATIC) PARTITION DEVICES
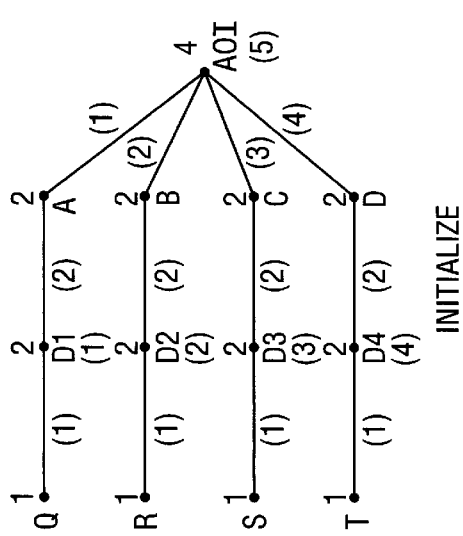
FIG. 15C (SCHEMATIC) PARTITION NETS
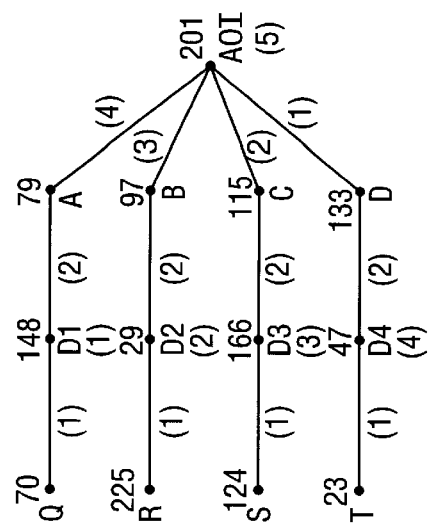
FIG. 16A (LAYOUT) INITIALIZE
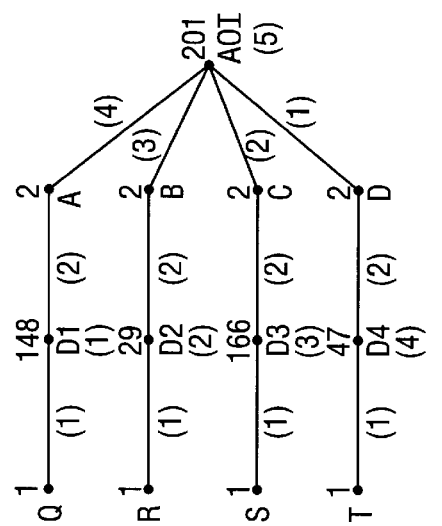
FIG. 16B (LAYOUT) PARTITION DEVICES
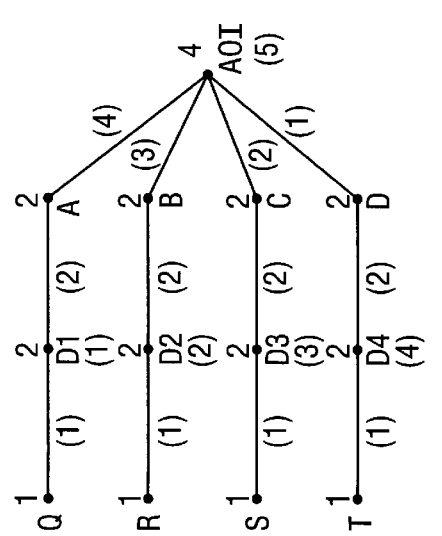
FIG. 16C (LAYOUT) PARTITION NETS

INITIALIZE (SCHEMATIC)

PARTITION DEVICES (SCHEMATIC)

INITIALIZE (CORRECT LAYOUT)

PARTITION DEVICES (CORRECT LAYOUT)

INITIALIZE (INCORRECT LAYOUT)

PARTITION DEVICES (INCORRECT LAYOUT)

PARTITION NETS (SCHEMATIC)

MULTIPLY BY CSM (SCHEMATIC)

PARTITION NETS (CORRECT LAYOUT)

MULTIPLY BY CSM (CORRECT LAYOUT)

PARTITION NETS (INCORRECT LAYOUT)

MULTIPLY BY CSM (INCORRECT LAYOUT)

METHODS, APPARATUS AND COMPUTER PROGRAM PRODUCTS FOR DETERMINING EQUIVALENCIES BETWEEN INTEGRATED CIRCUIT SCHEMATICS AND LAYOUTS USING COLOR SYMMETRIZING MATRICES

FIELD OF THE INVENTION

This invention relates to the design, layout, testing and manufacture of microelectronic circuits and systems, and more particularly to apparatus and methods for verifying microelectronic circuits and systems prior to manufacture.

BACKGROUND OF THE INVENTION

Present day ultra-large-scale integration (ULSI) circuits may include hundreds of thousands or millions of interconnected active electronic devices on an integrated circuit chip. The large capital investment required to fabricate and test large scale integrated circuits prior to sale to a customer and the difficulty, expense and loss of goodwill associated with reworking and replacing integrated circuits which fail to operate as planned, have increased the need to accurately characterize the electrical behavior of integrated circuits prior to their manufacture.

Moreover, now that submicron and deep-submicron (0.5 $\mu$m and below) technologies have begun to dominate silicon chip manufacturing and the prospect of million-plus-gate chips operating at clock rates of 100 MHz has become a reality, fundamental changes have had to be made to conventional integrated circuit design methodologies and the electronic design automation (EDA) tools based thereon. To meet the challenges posed by such large-scale circuits, techniques have been developed to represent integrated circuit designs at various levels of abstraction. According to these techniques, a design may be represented by a high-level behavioral description, as a schematic (or, equivalently, a netlist), or by geometric layout data which describes patterns of substances to be deposited on a semiconductor substrate (i.e., a layout). Other techniques for managing such highly integrated circuit designs include hierarchical design techniques. Here, a particular design is partitioned into functional cells and cells-within-cells, etc., so that at a given level of hierarchy the design may be analyzed as a set of cells and their respective interconnections, without being concerned with the details of the contents of the cells (e.g., subcells within each cell).

These techniques can be essential to the efficient performance of computer-assisted integrated circuit design verification. Such verification may include operations to perform layout versus schematic comparison (LVS) using computer-based design tools. As will be understood by those skilled in the art, tools to perform layout versus schematic comparison may include circuit extraction software to extract electrical schematics containing nets and devices from layout designs. An extracted electrical schematic may then be compared to an original schematic to determine functional equivalence between the original integrated circuit schematic and the integrated circuit layout. One difficulty associated with the performance of these operations may be caused by a dissimilarity in the labeling of nets and devices in the extracted schematic relative to the original schematic. Moreover, because it is not a trivial task to establish one-to-one correspondence between the components of the extracted schematic and the original schematic, the primary function of LVS software is to determine the correspondence or lack of correspondence between the original and extracted schematics which may be represented as a schematic netlist and layout netlist, respectively.

Conventional methods for determining correspondence between an original electrical schematic (e.g., schematic netlist) and a schematic which has been extracted from a layout (e.g., layout netlist) are described in U.S. Pat. No. 5,249,133 to Batra entitled "Method for the Hierarchical Comparison of Schematics and Layouts of Electronic Components"; U.S. Pat. No. 5,463,561 to Razdan entitled "High Capacity Netlist Comparison"; and U.S. Pat. No. 5,243,538 to Okuzawa et al. entitled "Comparison and Verification System for Logic Circuits and Method Thereof." Another conventional method for determining correspondence includes operations to represent the original schematic and extracted schematic as respective bipartite graphs having vertices which represent nets and devices. LVS software is then used to determine an isomorphism between the bipartite graphs.

The unambiguous determination of isomorphism between two arbitrary graphs may be a computationally intractable problem. To address this problem, heuristic methods for identifying graph isomorphisms with acceptable reliability and efficiency for ULSI designs have been developed. One generally established heuristic method is an iterative graph-coloring method described in articles by C. Ebeling and O. Zajicek entitled "Validating VLSI Circuit Layout By Wirelist Comparison," Proceedings of ICCAD, pp. 172–173 (1983); and by C. Ebeling entitled "Gemini II: A Second Generation Layout Validation Program," IEEE ICCAD-88, Digest of Technical Papers, pp. 322–325, November 7–10 (1988), the disclosures of which are hereby incorporated herein by reference. As described in these articles, an integer (color) is assigned to each vertex of a bipartite graph of the original schematic and extracted schematic, based on a graph invariant such as "number of neighbors" (i.e., adjacent vertices). Each vertex is iteratively recolored as a function of the colors of its neighbors, until the maximum number of unique colors is achieved. Because these operations are independent of labeling, equivalent original and extracted schematics will be represented by the same set of colors. A one-to-one correspondence may then be achieved by simply matching up each vertex in the schematic with a vertex in the layout of the same color.

Unfortunately, some circuits may exhibit symmetry which may cause different vertices to receive the same color because the "neighborhoods" associated with these vertices look alike. Thus, when two or more vertices have the same color, ambiguities in selecting matching vertices may arise. Typically, this situation is handled by making a guess as to which ones of the same colored vertices in the extracted schematic correspond to the same colored vertices in the original schematic, then assigning new colors to the matched vertices and then recoloring. If the guess was incorrect, a number of vertices may fail to match when the matching is applied at the next level of hierarchy, even though an alternate guess might have resulted in a complete one-to-one mapping.

For example, the AND-OR-INVERT (AOI) cell of FIG. 1 exhibits a number of symmetries with respect to input A because input A may be independently swapped with input B or input A may be swapped with input C if and only if input B is swapped with input D. Similar symmetries also exist with respect to inputs B, C and D. FIG. 2 illustrates an original electrical schematic (S1) of the AOI and an extracted electrical schematic (L1) of the AOI which will be referred to as "the layout". FIG. 3 illustrates an electrical schematic design (S2) which contains the AOI schematic cell (S1) of FIG. 2 as a subcell and a layout design (L2) which contains the AOI layout (L1) of FIG. 2 as a subcell.

As will be understood by those skilled in the art, verification of the designs of FIG. 3 will only be concerned with the mapping of ports (W, X, Y, Z) of the layout L1 of FIG. 2 to the ports (Q, R, S, T) of the schematic S2 of FIG. 2. However, because the symmetry of the design will cause ports A, B, C, D to acquire the same color, a conventional LVS tool may make an arbitrary mapping which may be incorrect (e.g., Q→W, R→Y, S→X, T→Z). A consequence of this arbitrary mapping may be manifested at the next level of hierarchy. For example, as illustrated by FIG. 3, an incorrect choice in the mapping of S1 to L1 (i.e., the child cells) may cause S2 and L2 (i.e., the parent cells) to be reported as nonequivalent. Here, devices D1–D4 are distinct devices that are connected between the ports of the AOI "child" cell and the ports of the "parent" cell. Thus, LVS software may report a mismatch between an original schematic and an extracted schematic/layout, even though it is possible to make assignments among symmetric vertices that will result in a match. Typically, a consequence of this limitation in LVS software is that the software user must manually intervene by providing the LVS software with specific assignments to resolve ambiguities due to symmetry. Since it is not always clear where an erroneous guess was made, such manual intervention may be time consuming. For highly symmetric designs such as memories and gate arrays, these limitations may significantly reduce the utility of LVS software.

To address some of these limitations associated with conventional verification tools, an LVS software tool 100 has been developed to determine equivalency between an integrated circuit schematic and an integrated circuit layout, using the operations 102–114 illustrated by the flow diagram of FIG. 4. This LVS software tool is a commercially available product from the assignee of the present application, Avant! Corporation of Sunnyvale, Calif. This software product, which is marketed under the tradename Hercules™, is more fully described in an instruction manual by the same name, Release 2.1, January (1997), the disclosure of which is hereby incorporated herein by reference. In particular, the LVS software tool of FIG. 4 can perform the operations of generating a hierarchical electrical schematic netlist having at least one parent cell and a plurality of child cells in the parent cell, Block 102, and extracting a corresponding integrated circuit layout as a hierarchical layout netlist, Block 104. An operation is also performed to generate at least one color symmetrizing matrix corresponding to a child cell in the schematic netlist, Block 106. Here, the child cell may have a number of symmetries which, when taken alone or in combination, may result in a number of electrically equivalent permutations of the child cell. As illustrated by Block 108, operations are then performed to generate schematic and layout graphs of the parent cells in the schematic and layout netlists, respectively. These graphs are similar to the above-described bipartite graphs. The vertices in the schematic graph are then colored and a first color symmetry vector is generated for a child cell in the schematic graph. Similarly, the vertices in the layout graph are colored and a second color symmetry vector is generated for a child cell in the layout graph, Block 110.

An operation is then performed to determine an equivalency between the colors of the vertices in the schematic and layout graphs based on a selected permutation of the child cell in the layout graph, Block 112, and then an operation is performed to determine a vector equivalency between a product of the color symmetrizing matrix and the first color vector and a product of the color symmetrizing matrix and the second color vector, Block 114. Finally, a membership test is automatically performed at Block 116 to determine whether the selected permutation of the child cell can be derived from the valid symmetries associated with that child cell. As described in a textbook authored by G. Butler, entitled *Fundamental Algorithms for Permutation Groups*, Springer-Verlag, p. 144 (1991), a Furst-Hopcroft-Luks version of a Schreier-Sims method may be performed. Unfortunately, although the software tool of FIG. 4 typically requires no human intervention, provides adequate performance and works well with most designs exhibiting symmetry, the automatic performance of membership test to validate the accuracy of the matched layout and schematic may incur an unduly large computational expense and limit the applicability of the above software to large integrated circuit designs having large degrees of symmetry.

Thus, notwithstanding the above described attempts at providing LVS verification tools, there continues to be a need to provide verification tools which have the capability of automatically resolving ambiguities in symmetric circuits. Such tools should be conservative in the identification of graph isomorphism, in the sense that if any ambiguities remain after the verification operations are performed, a nonisomorphism result should be generated and the circuits should be designated as non-equivalent even if they may be equivalent. This is because the penalty for erroneously identifying equivalent circuits as nonequivalent (i.e., manual intervention by the user) is far less onerous than the penalty for misidentifying non-equivalent circuits as equivalent (i.e., the expense of prototyping and manufacturing an incorrect design).

SUMMARY OF THE INVENTION

It is therefore an object of the present invention to provide improved methods, apparatus and computer program products for performing post-layout verification of microelectronic integrated circuits.

It is also an object of the present invention to provide improved methods, apparatus and computer program products for performing layout versus schematic comparison of integrated circuits.

It is another object of the present invention to provide methods, apparatus and computer program products for performing layout versus schematic comparison of hierarchical integrated circuits having symmetrical cells therein.

These and other objects, features and advantages are provided, according to the present invention, by methods, apparatus and computer program products for determining equivalency between hierarchical integrated circuit schematics and hierarchical integrated circuit layout designs using color symmetrizing matrices and preferred operations to detect absence of spurious symmetries in the color symmetrizing matrices. These operations are preferably performed to reduce computational expenses associated with the performance of complex membership tests to determine whether permutations of cells in a hierarchical integrated circuit layout design, which are assigned during layout versus schematic comparison operations, can be derived from valid symmetries of the respective cells.

In particular, the present invention includes a layout versus schematic (LVS) comparison tool and computer program products which determine one-to-one equivalency between an integrated circuit schematic and an integrated circuit layout by performing an operation to generate a color symmetrizing matrix corresponding to a child cell in the integrated circuit schematic. Here, the integrated circuit schematic contains at least one child cell and a parent cell containing the at least one child cell. The at least one child cell is also characterized as having a number of symmetrical configurations which at a port level are electrically equivalent. In integrated circuits having a large number of repetitive devices, the number of child cells having symmetrical ports is typically large. Operations are also performed to generate a first color symmetry vector for the child cell in the integrated circuit schematic and a second color symmetry vector for the corresponding child cell in the integrated circuit layout. Similar respective operations are also performed for the other child cells. A vector equivalency is also preferably determined by comparing a product of the color symmetrizing matrix and the first color symmetry vector against a product of the color symmetrizing matrix and the second color symmetry vector. A vector equivalency is established if the numeric entries in the two vectors are the same, even if their ordering is different. Notwithstanding the presence of a vector equivalency, a possibility may still exist that with respect to the corresponding symmetric child cells in the schematic and layout, isomorphism (i.e., one-to-one correspondence) between the schematic and layout is not present. To address this possibility, an operation is preferably performed to detect the absence of a spurious symmetry in the color symmetrizing matrix. A spurious symmetry is an additional symmetry of the color symmetrizing matrix which is not a desired symmetry based on symmetrical rules associated with the corresponding child cell. If an absence is detected, the presence of the vector equivalency will unequivocally establish the one-to-one correspondence with respect to the child cells being analyzed. Therefore, the need to perform a computationally expensive membership test to determine whether a selected permutation can be derived from valid symmetries can be successfully eliminated.

According to one embodiment of the present invention, a method of determining equivalency between an integrated circuit schematic and an integrated circuit layout includes the steps of representing the integrated circuit schematic as a hierarchical schematic netlist having at least one child cell therein and a parent cell containing the at least one child cell. A step is also performed to extract the integrated circuit layout as a hierarchical layout netlist. A color symmetrizing matrix corresponding to the child cell is also generated. A schematic graph of the parent cell in the hierarchical schematic netlist is also generated along with a layout graph of the parent cell in the hierarchical layout netlist. Using conventional techniques, the vertices in the schematic graph are colored and a first color symmetry vector for the child cell therein is generated from the colors of the ports of the child cell in the graph. Similarly, the vertices in the layout graph are colored and a second color symmetry vector for the child therein is generated. An equivalency between the colors of the vertices in the schematic graph and the colors of the vertices in the layout graph is then determined.

Based on this equivalency, a step is then performed to determine a vector equivalency between a product of the color symmetrizing matrix and the first color symmetry vector and a product of the color symmetrizing matrix and the second color symmetry vector. If these vectors are equivalent, it is likely that an equivalency between the integrated circuit schematic and the integrated circuit layout is present. However, rather than automatically performing complex membership tests which may require considerable amounts of computational expense to confirm equivalency (particularly for large integrated circuits having high degrees of symmetry), a step is performed to detect absence of a spurious symmetry in the color symmetrizing matrix by initially checking whether the number of actual symmetries of the color symmetrizing matrix is equivalent to the number of different symmetrical port configurations or permutations of the child cell undergoing analysis (i.e., the number of desired symmetries). If the number of actual symmetries of the color symmetrizing matrix is greater than the number of desired symmetries, a membership test will need to be performed to verify equivalency. If, on the other hand, the number of actual and desired symmetries are determined to be the same, a computationally expensive step to perform a membership test can be eliminated altogether. Thus, the present invention provides layout versus schematic (LVS) comparison tools and computer program products which can be used to perform post-layout verification of larger and more highly integrated circuits which possess large numbers of symmetric cells (e.g., memories, gate arrays, etc.), relative to conventional tools.

BRIEF DESCRIPTION OF THE DRAWINGS

FIG. 5 illustrates a functional block diagram of microelectronic integrated circuit synthesis, layout, verification and manufacturing tools according to the present invention.

FIG. 6 illustrates a general hardware description of post-layout verification tools according to the present invention.

FIG. 7 illustrates general operations performed by post-layout verification tools, methods and computer program products according to the present invention.

FIGS. 13A–F and 14A–F illustrate a sequence of bipartite schematic and layout graphs corresponding to the AOI child cell of FIG. 1, respectively.

FIGS. 15A–C and 16A–C illustrate a sequence of bipartite schematic and layout graphs corresponding to the parent cell of FIG. 3, respectively.

DESCRIPTION OF A PREFERRED EMBODIMENT

Figure 1:
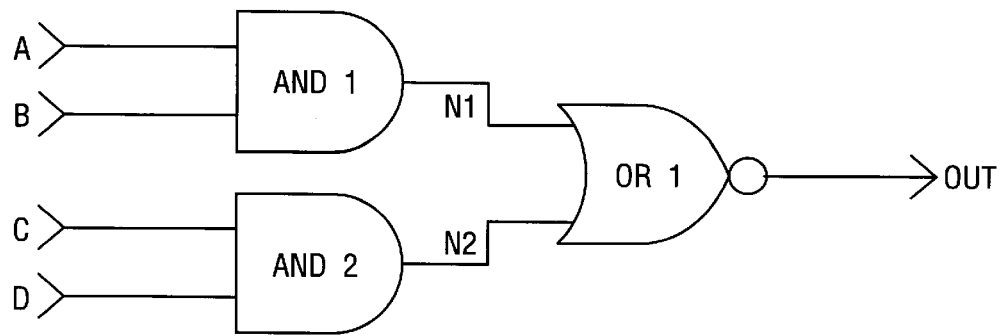
FIG. 1 is an electrical schematic of an AND-OR-INVERT (AOI) circuit.
Figure 2:
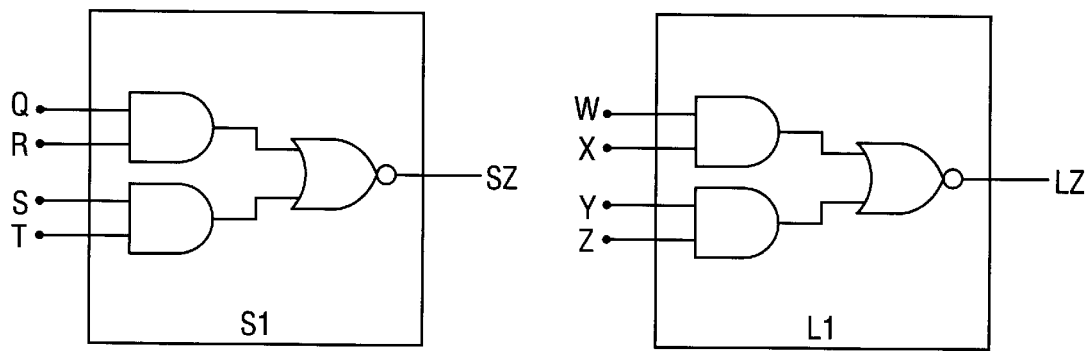
FIG. 2 is an electrical schematic of an AOI cell (S1) and a schematic of an AOI cell (L1).

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Referring now to FIG. 5, operations performed by a preferred computer aided microelectronic integrated circuit synthesis, layout, verification and manufacturing system 10 will be generally described. The system includes four general subsystems: an integrated circuit functional specification and logic synthesis system 200, an integrated circuit layout system 300, a post-layout verification system 400 and an integrated circuit manufacturing system 500. The microelectronic integrated circuit functional specification and logic synthesis system 200 may include circuit libraries or macros for such elements as logic gates, flip-flops, registers, memory elements, drivers and buffers, for example. The functional specification and logic synthesis system 200 typically provides a vehicle for generating and displaying an electrical schematic of an integrated circuit and producing a computer readable representation of the schematic as a design netlist. The microelectronic integrated circuit layout system 300 also typically provides a vehicle for generating a physical layout by placing and routing an electrical circuit schematic generated by the functional specification and logic synthesis system 200. A wiring program may also be provided with the layout system 300 for automatically determining the placement of the wiring interconnect nets between the active device elements of the microelectronic integrated circuit.

A verification system 400 is also preferably provided for performing an independent verification of the physical layout to ensure compliance with the requirements of the functional specification and logic synthesis system 200 as well as the manufacturing system 500. Accordingly, the verification system 400 is typically referred to as a "post-layout" verification system and is typically employed near the end of the design process. In addition to acting as an independent verification of the operability and correctness of the layout of the circuit design, the verification system 400 may provide means by which changes and optimizations can be performed. As will be understood by those skilled in the art, various other types of analyses such as timing analysis and circuit/logic simulation may be performed to check whether the specifications and requirements of the first two subsystems 200 and 300 are satisfied. After verification, the physical layout is forwarded to the manufacturing system 500 to produce the integrated circuit. The microelectronic circuit manufacturing system 500 may generate the required masks, and may control the manufacturing tools necessary to fabricate the integrated circuit on a semiconductor wafer, for example.

It will be understood by those having skill in the art that the integrated circuit functional specification and logic synthesis system 200, microelectronic circuit layout system 300 and various parts of the microelectronic integrated circuit manufacturing system 500 may be realized in whole or in part as software modules running on a computer system. Alternatively, a dedicated stand-alone system with application specific integrated circuits for performing the above described functions may be provided. The general design and operation of the functional specification and logic synthesis system 200, layout system 300 and manufacturing system 500 are well known to those having a skill in the art and need not be described further herein.

Referring now to FIG. 6, a general hardware description of a computer workstation containing, among other things, the integrated circuit post-layout verification system 400 of FIG. 5 will be described. As shown by FIG. 6, the workstation 20 preferably includes a computer 15 containing a hierarchical post-layout verification software sub-system 400 running thereon. The post-layout verification system 400 may accept a computer representation of the electrical schematic and layout of an integrated circuit via a file 19, disk input 23 or data bus 27. A display 13 and printer 17 are also preferably provided to assist in verifying the layout and design of the integrated circuit. The hardware design of the above described components 13, 17, 19, 27 and 23 is well known to those having skill in the art and need not be described further herein. As one example, the post-layout verification system 400 may be run on a computer system such as a UNIX-based workstation.

Referring now to FIG. 7, there is illustrated a general overview of the operations performed by the post-layout verification system 400 of the present invention. In particular, the post-layout verification system 400 is illustrated as performing five (5) operations 410–460. For the sake of clarity, these operations are illustrated and described as discrete operations, however, combinations of these operations may be performed simultaneously. The first operation 410 is performed by a design rule checking (DRC) tool which runs comprehensive hierarchical design rule checks on a geometric database containing the physical layout of an integrated circuit to be verified. The operations performed by the design rule checking tool include, among other things, checking for area, grid, length, size, spacing, corner, enclosure, intersection and overlap errors, for example. The second operation 420 is performed by a preferred hierarchical layout versus schematic (LVS) tool which extracts a hierarchical netlist from the geometric layout database and compares it to the electrical schematic netlist. Layout and schematic logic agreement is then verified at hierarchical matching points, as described more fully hereinbelow with respect to the flow charts of FIGS. 8–9.

The third and fourth operations 440 and 450 are performed by a layout parameter extraction (LPE) tool and a critical path timing analysis tool. These tools may perform the functions of extracting layout critical nets preferably by performing a multi-tiered layout parameter extraction of typically all interconnect nets in the geometric layout database and determining delay bounds for those nets. Once this layout parameter extraction operation 440 is complete, an operation 450 is performed to determine which paths in the integrated circuit constitute timing critical paths. As illustrated by the reverse upward sequence of arrows in FIGS. 5 and 7, the performance of post-layout verification may necessitate redesign of the integrated circuit by the functional specification and logic synthesis system 200 and/or modifying the physical layout using the layout system 300. Finally, in the event the integrated circuit is verified for design rule compliance and the layout versus schematic comparison, extraction and critical path determinations yield acceptable results, the physical layout is forwarded to the manufacturing system 500 to produce the integrated circuit.

The operations of the present invention, as described more fully hereinbelow, may be performed by an entirely hardware embodiment, an entirely software embodiment or an embodiment combining software and hardware aspects. Furthermore, the present invention may take the form of a computer program product on a computer-readable storage medium having computer-readable program code means embodied in the medium. Any suitable computer-readable medium may be utilized including hard disks, CD-ROMs or other optical or magnetic storage devices.

Figure 8:
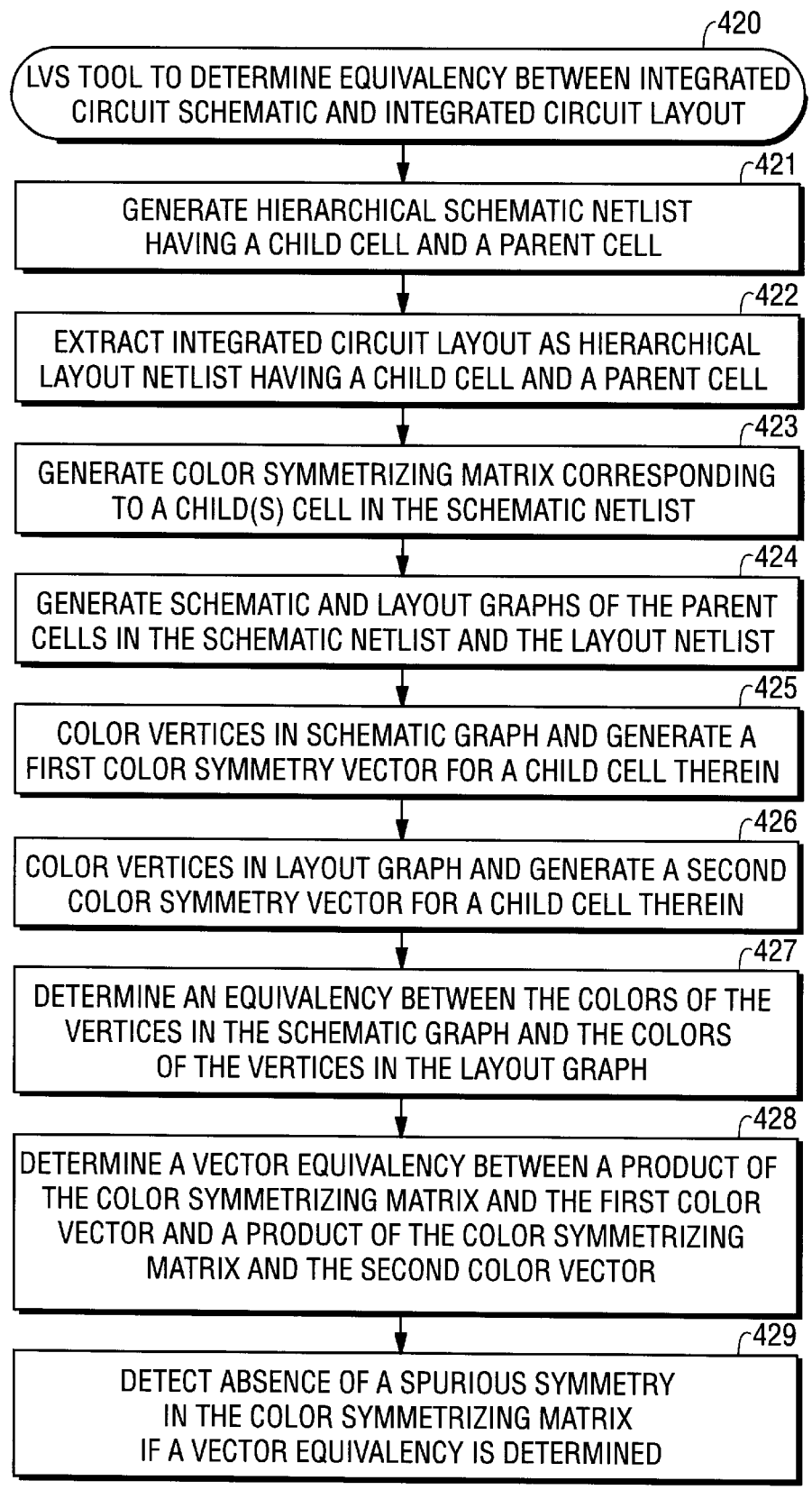
FIG. 8 is a flow diagram of operations performed by layout versus schematic (LVS) comparison tools and computer program products according to a preferred embodiment of the present invention.
Figure 9:
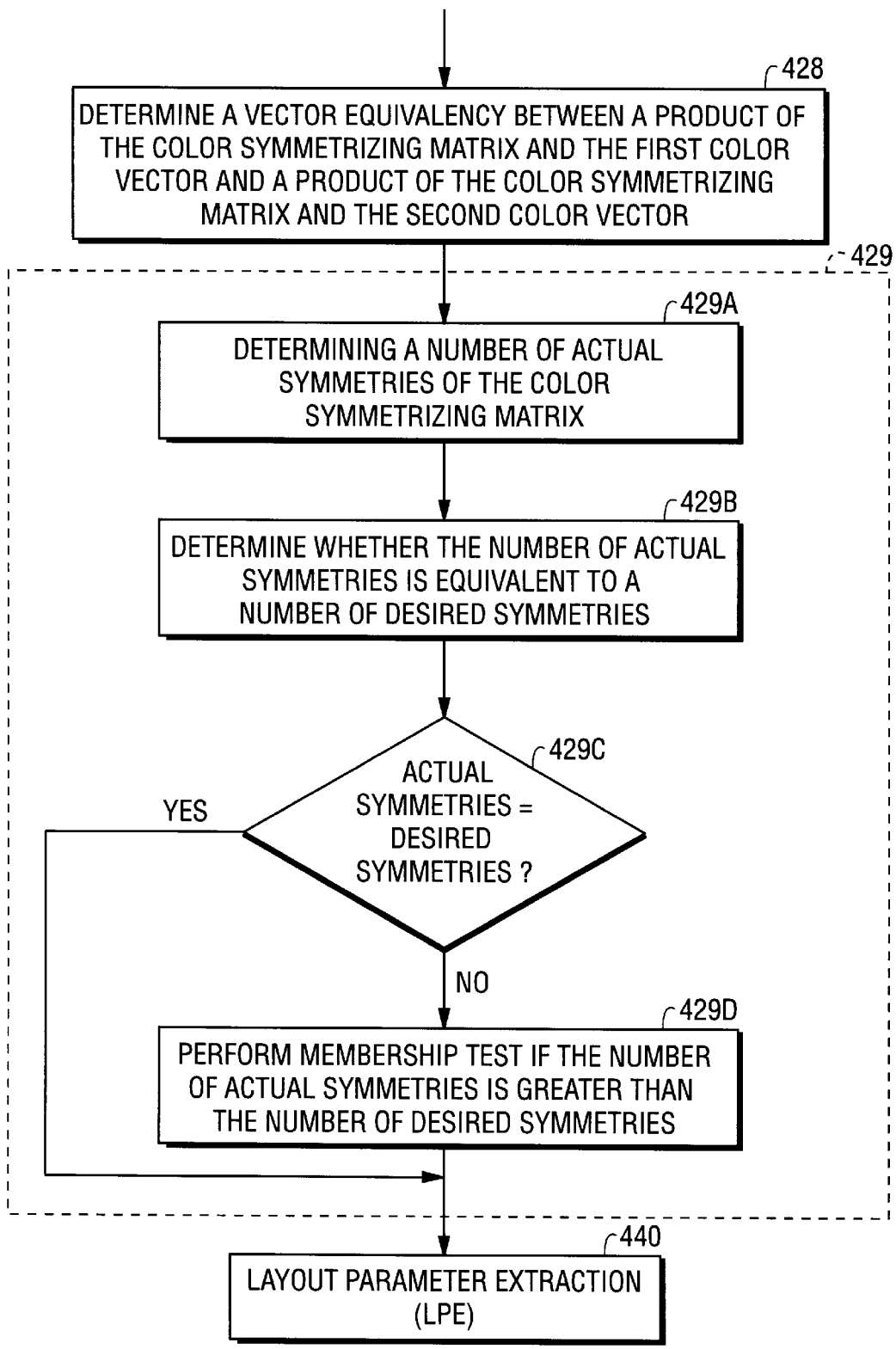
FIG. 9 is a partial flow diagram illustrating operations to detect absence of spurious symmetries in color symmetrizing matrices, according to the present invention.

Operations for various aspects of the present invention are illustrated in detail in FIGS. 8 and 9 which are flowchart illustrations. It will be understood that each block of the flowchart illustrations, and combinations of blocks in the flowchart illustrations, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory that can direct a processor or other programmable data processing apparatus to function in a particular manner, such that the instructions stored in the computer-readable memory produce an article of manufacture including instruction means which implement the functions specified in the flowchart block or blocks. Accordingly, blocks of the flowchart illustrations support combinations of means for performing the specified functions, combinations of steps for performing the specified functions and program instruction means for performing the specified functions.

Referring now to FIGS. 7–9, preferred operations 420 performed by a layout versus schematic comparison tool of the present invention will now be described. In particular, this comparison tool performs operations to determine equivalency between hierarchical integrated circuit schematics and hierarchical integrated circuit layout designs using color symmetrizing matrices and preferred techniques to detect absence of spurious symmetries in the color symmetrizing matrices. These operations are preferably performed to reduce the computational expenses associated with the automatic performance of complex membership tests to determine whether permutations of cells in a hierarchical integrated circuit layout design can be derived from valid symmetries of the respective cells therein.

According to one embodiment of the present invention, operations to determine equivalency between an integrated circuit schematic and an integrated circuit layout include representing the integrated circuit schematic as a hierarchical schematic netlist having at least one child cell therein and a parent cell containing the at least one child cell, Block 421. An operation is also performed to extract the integrated circuit layout as a hierarchical layout netlist, Block 422, using conventional techniques. As described more fully hereinbelow with respect to an exemplary portion of an integrated circuit containing an AND-OR-INVERT (AOI) cell therein as a child cell, a color symmetrizing matrix corresponding to the child cell is also generated, Block 423. A bipartite schematic graph of the parent cell in the hierarchical schematic netlist is also generated along with a bipartite layout graph of the parent cell in the hierarchical layout netlist, Block 424. The vertices in the schematic graph are then colored and a first color symmetry vector for the child cell therein is generated from the colors of the ports of the child cell in the graph, Block 425. Similarly, the vertices in the layout graph are colored and a second color symmetry vector for the child therein is generated, Block 426. An equivalency between the colors of the vertices in the schematic graph and the colors of the vertices in the layout graph is then determined, Block 427.

Based on this equivalency, an operation is then performed to determine a vector equivalency between a product of the color symmetrizing matrix and the first color symmetry vector and a product of the color symmetrizing matrix and the second color symmetry vector, Block 428. If these vectors are equivalent, an equivalency between the integrated circuit schematic and the integrated circuit layout may be present. However, a possibility may still exist that with respect to the corresponding symmetric child cells in the schematic and layout, isomorphism (i.e., one-to-one correspondence) between the schematic and layout is not present.

To address this possibility, an operation is preferably performed to detect the absence of a spurious symmetry in the color symmetrizing matrix. If an absence is detected, the presence of the vector equivalency will unequivocally establish the one-to-one correspondence with respect to the child cell being analyzed. Therefore, the need to perform a computationally expensive membership test to determine whether a selected permutation can be derived from valid symmetries can be successfully eliminated. In particular, rather than automatically performing a complex membership test which may require considerable amounts of computational expense to confirm equivalency (particularly for large integrated circuits such as memories and gate arrays which have high degrees of symmetry), an operation is performed to detect absence of a spurious symmetry in the color symmetrizing matrix, Block 429, by initially checking whether the number of actual symmetries of the color symmetrizing matrix is equivalent to the number of different symmetrical port configurations or permutations of the child cell undergoing analysis (i.e., the number of desired symmetries), Blocks 429A–429B. As illustrated by Blocks 429C and 429D, If the number of actual symmetries of the color symmetrizing matrix is greater than the number of desired symmetries, a membership test will need to be performed to verify equivalency. If, on the other hand, the number of actual and desired symmetries are determined to be the same which, in practice, has been found to be true in the vast majority of cases, the computationally expensive membership test can be eliminated altogether. These operations are repeatedly performed for all cells, at each level of hierarchy. Then, once complete layout versus schematic equivalency is found for the entire integrated circuit, control of the post-layout verification system can be passed to the layout parameter extraction (LPE) tool, Block 440.

Figure 10:
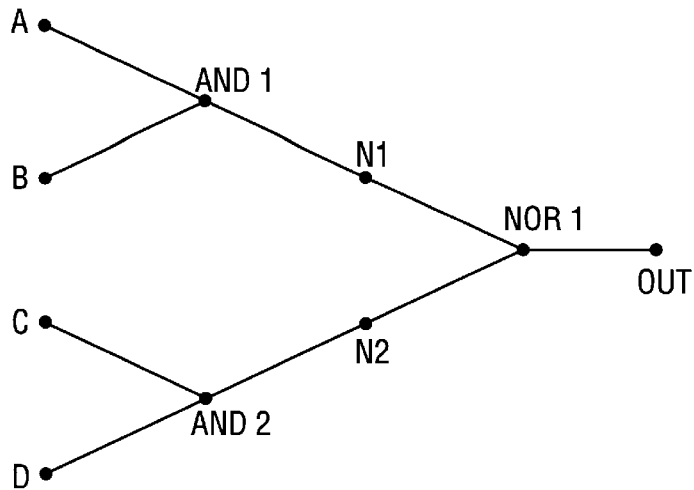
FIG. 10 illustrates a graphical representation of the symmetrical AOI circuit of FIG. 1.

Further description of the above preferred operations of FIGS. 8 and 9 will now be provided by illustrating performance of these operations on an integrated circuit containing an AND-OR-INVERT (AOI) cell therein as a child cell. In particular, schematic and layout netlists are initially generated for corresponding schematic and layout designs of a hierarchical integrated circuit. Here, the layout netlist may be generated by extracting the layout design using conventional techniques well known to those skilled in the art. The schematic and layout netlists are then abstracted into respective bipartite graphical representations where the vertices of the graph represent devices or nets. For example, FIG. 10 illustrates a graphical representation of the symmetrical AOI circuit of FIG. 1. The graphical schematic and layout representations are provided with an initial partitioning of vertices which distinguishes between nets and devices, and also between external nets (e.g., input ports A, B, C, D and output port Z) and internal nets (N1 and N2). As will be understood by those skilled in the art, graphical automorphism detection operations are then performed on the graphical representations. Here, the purpose of the initial partitioning is to constrain the automorphism operations to find symmetries that do not involve swapping between partitions. Moreover, because the ability to swap devices and nets is an artifact of the graphical abstraction and not a real possibility, it may be excluded. Swapping of ports and internal nets may also be excluded because hierarchical analysis is only concerned with symmetries among ports.

Using conventional techniques such as those described in the aforementioned Ebeling articles, an iterative coloring process is then applied to the vertices of the schematic and layout graphs. As will be understood by those skilled in the art, the establishment of unique colors at the vertices of the schematic and layout graphs typically permits matching of the vertices. Vertices that may be swapped by a valid symmetry will also have identical colors. However, in order to distinguish between good and bad permutations, a set (e.g., vector) of color values will need to be established using a coloring function (F) that depends not just on the neighbors of a vertex, but on all the vertices that share a symmetry with it. Here, a coloring function is required that results in the same set of colors when applied to valid permutations and a different set of colors when applied to invalid permutations. In particular, when the layout is a valid permutation of the schematic, the coloring function will result in the same set of colors for the layout and schematic, and these colors will be related by the permutation. On the other hand, when the layout is not a valid permutation of the schematic, the coloring function will result in different sets of colors.

The preferred coloring function (F) may be characterized algebraically, where:

$\vec{n}$ = vector of color values $P_g$, $P_b$ = good & bad permutations $\vec{n}'$ = new color values $\vec{n}' = F(\vec{n})$ Require:

$F(P_g(\vec{n})) = P_g(\vec{n}') = P_g(F(\vec{n}))$ $F(P_b(\vec{n})) \neq P_b(\vec{n}') = P_b(F(\vec{n}))$ Assume F and P can be represented by matrix multiplication:

$F(\vec{n}) = F\vec{n}$ $P(\vec{n}) = P\vec{n}$

Require $\forall \vec{n}$:

$FP_g\vec{n} = P_gF\vec{n}$ $(FP_b\vec{n})_i \neq (P_bF\vec{n})_i$

Note that the condition that $(FP_b\vec{n})_i \neq (P_bF\vec{n})_i$ is more stringent than the condition that $FP_g\vec{n} = P_gF\vec{n}$ because not only must the two sides of the equation be unequal, but each component of each side must be unequal. With this understood, a simplification may be performed:

$FP_g = P_gF$ $FP_b \neq P_bF$

Finally:

$P_g^{-1}FP_g = F$ $P_b^{-1}FP_b \neq F$

These equations describe a matrix F which is symmetric with respect to the permutation represented by $P_g$, but not symmetric with respect to pb Thus, the required function is a matrix which exhibits symmetry with respect to all legal permutations and violates symmetry with respect to all illegal permutations.

As described above, this preferred matrix is a color symmetrizing matrix (CSM). An exemplary CSM which encodes the symmetries of the AOI cell of FIG. 1 is provided as:

$$CSM = \begin{bmatrix} 0 & 11 & 13 & 13 \\ 11 & 0 & 13 & 13 \\ 13 & 13 & 0 & 11 \\ 13 & 13 & 11 & 0 \end{bmatrix}$$

Figure 11:
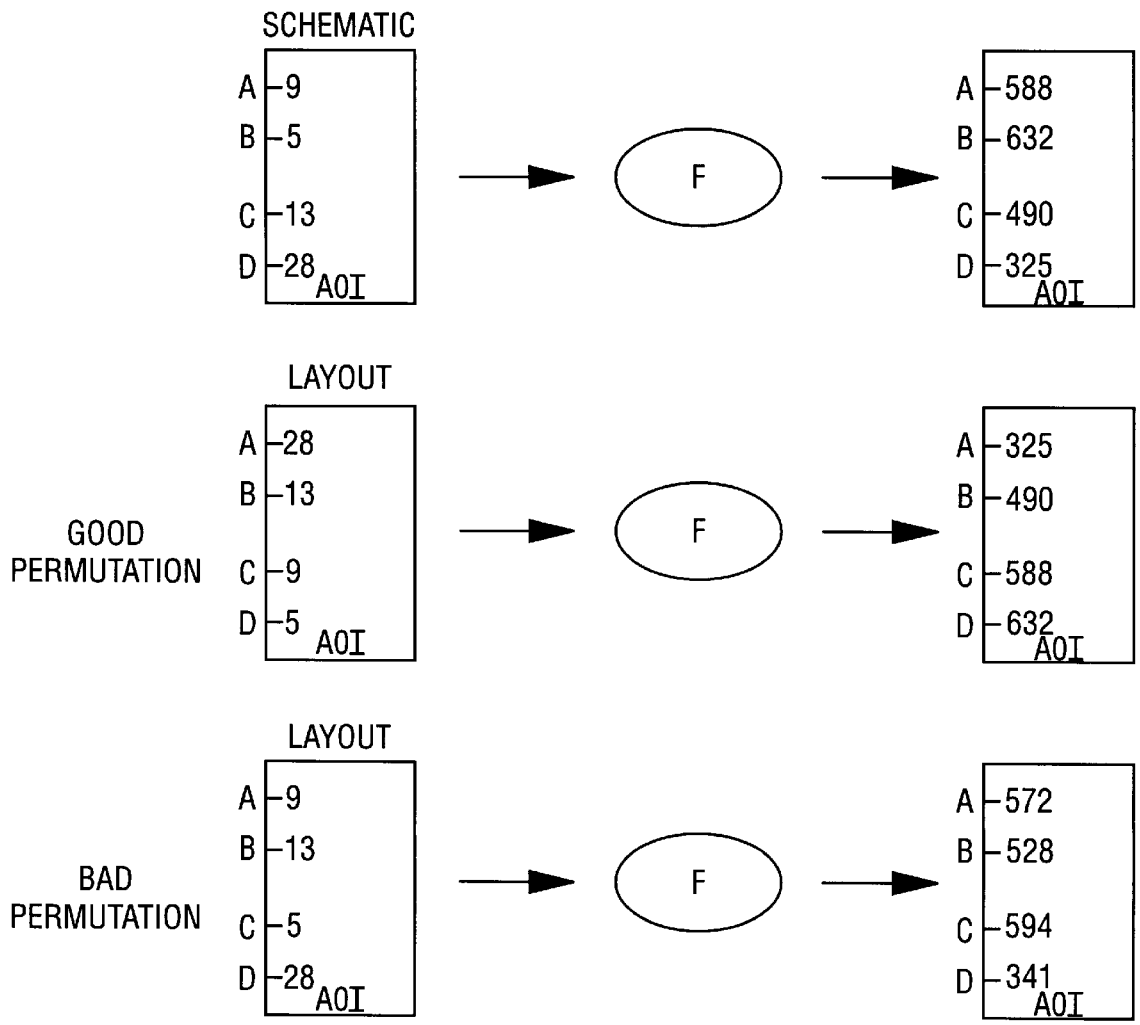
FIG. 11 illustrates operations to determine a first product of the color symmetrizing matrix (for the AOI circuit of FIG. 1) and a first color symmetry vector corresponding to an AOI child cell in a schematic graph, a second product of the color symmetrizing matrix and a second color symmetry vector corresponding to an AOI child cell in a layout graph configured as a good permutation, and a third product of the color symmetrizing matrix and a third color symmetry vector corresponding to an AOI child cell in a layout graph configured as a bad permutation.

As illustrated best by FIG. 11, respective products of the CSM and (i) a vector of colors for the schematic AOI, (ii) a correctly permuted vector of colors associated with the layout AOI and (iii) an incorrectly permuted vector of colors associated with the layout AOI, results in two vectors (486, 514, 350, 245) and (245, 350, 486, 514) which have the same set of color values and are thereby equivalent, and one vector (454, 426, 438, 277) which is different. The vectors which agree correspond to the schematic and layout based on a "good" permutation of the AOI cell. Accordingly, a determination of vector equivalency for all cells at each level of hierarchy, Block 428 of FIGS. 8 and 9, can be used to determine LVS equivalency.

A preferred approach to form the above CSM includes building the matrix in the most restrictive way possible so that the matrix is guaranteed to have all the desired symmetries. According to a preferred aspect of the invention, the matrix is constructed by starting with an empty (zero) matrix (with dimensions equal to the number of interdependent ports: e.g., a 4×4 matrix for an AOI cell) and inserting an arbitrary number somewhere into the matrix. Prime numbers are preferably used to minimize the probability of collisions. This prime number is then copied into every entry whose indices can be related to the indices of the original entry by some combination of legal permutations. The result is a matrix which is symmetric with respect to all legal permutations. If there are any empty entries in the matrix remaining, a new and different number is inserted into an empty entry, and the process is repeated. This procedure is continued until there are no empty entries. At the end of any given iteration, the CSM matrix is provided with the desired symmetries, however, by iterating until the matrix is full, it is possible to minimize the probability of spurious symmetries.

A preferred method of counting the number of symmetries of the CSM is based on a version of the Schreier-Sims algorithm. This version is more fully described in Chapter 10 of the aforementioned textbook by G. Butler entitled "*Fundamental Algorithms for Permutation Groups*" and in Chapter 14 of a textbook by P. Cameron entitled "*Combinatorics*" Cambridge University Press (1994), the disclosure of which is hereby incorporated herein by reference. In particular, this preferred method includes determining a number N equal to the index of the last row of the CSM matrix (N=4 for the CSM matrix corresponding to the AOI cell). The orbit of N is then determined. Here, an orbit is defined as the set of indices (include N itself) which N may be mapped into by any legal permutation or combination of permutations. Next, any permutations which involve moving N are ignored so that attention is restricted to the subgroup that is the stabilizer of N. Then, counting backwards from N, the next non-unique row is found and N is then set to this index. These steps are repeated until the subgroup is of the order one.

Unfortunately, it is not possible to guarantee that such a matrix will not have "spurious" symmetries which might enable an incorrectly permuted vector of colors to be reported as correct. If a spurious symmetry is present in the CSM, the preferred LVS comparison tool may still make a correct mapping, but it is not forbidden from making an incorrect mapping. However, according to the present invention, an incorrect mapping can be prevented by determining the number of actual symmetries of the CSM (i.e., the order of the permutation group which leaves the matrix invariant), Block 429A in FIG. 9, and then comparing this number with the number of desired symmetries of the particular child cell being analyzed. If these two numbers are equal, the CSM matrix will be guaranteed to have all desired symmetries and no spurious symmetries. Thus, the determination of vector equivalency at Block 428 of FIGS. 8 and 9 will unequivocally establish equivalency between the schematic and layout. If the number of actual symmetries of the CSM is greater than the number of desired symmetries (the number of actual symmetries of the CSM should never be less), a further check will need to be performed to verify LVS equivalency. This further check includes performing a membership test, preferably using a Schreier-Simms algorithm, to verify that the final mapping is a valid combination of the original symmetries.

As will be understood by those skilled in the art, the Schreier-Simms algorithm is a standard method which can be used to determine whether an arbitrary permutation may be expressed by some combination of generated permutations. If the mapping fails this test, the schematic and layout are reported as nonequivalent, but if the mapping passes this test, the schematic and layout will be reported as equivalent notwithstanding the fact that the number of actual symmetries of the CSM was greater than the number of desired symmetries associated with the symmetric cell under analysis. Thus, the present invention provides layout versus schematic (LVS) comparison tools and computer program products which can be used to perform post-layout verification of larger and more highly integrated circuits which possess large numbers of symmetric cells (e.g., memories, gate arrays, etc.), relative to conventional tools, because the need to always perform computationally expensive membership tests to determine whether a selected permutation of a symmetric cell can be derived from valid symmetries, can be frequently eliminated.

Figure 12A:
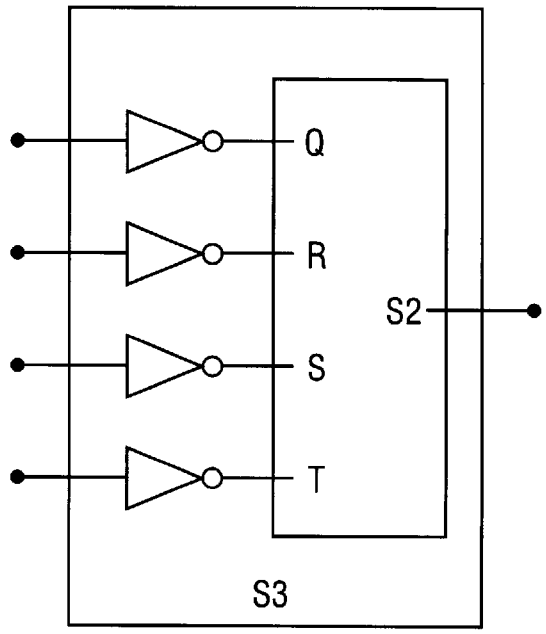
FIGS. 12A and 12B illustrate electrical schematics of parent cells having the same symmetries as respective child cells therein.
Figure 12B:
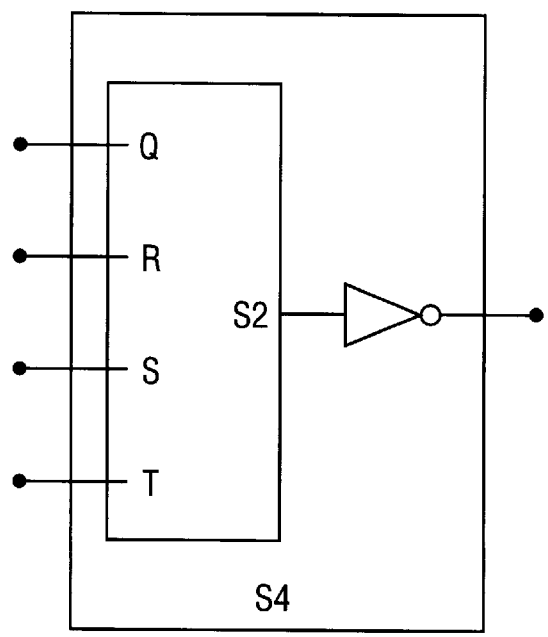
Figure 17A:
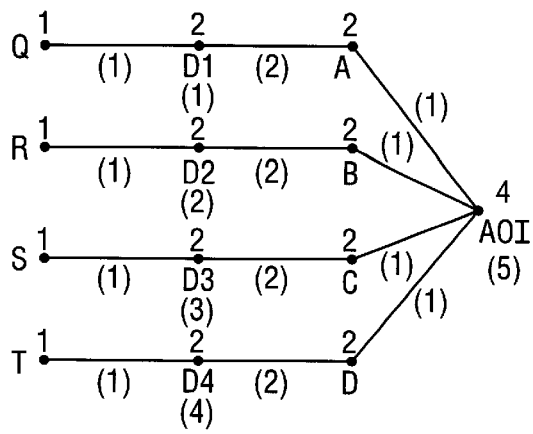
FIGS. 17A–D, 18A–D and 19A–D illustrate a sequence of schematic graphs, correct layout graphs and incorrect layout graphs of a parent cell of FIG. 3, respectively.
Figure 17B:
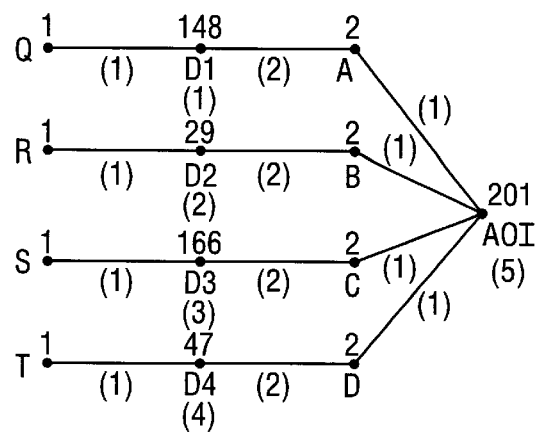
Figure 18A:
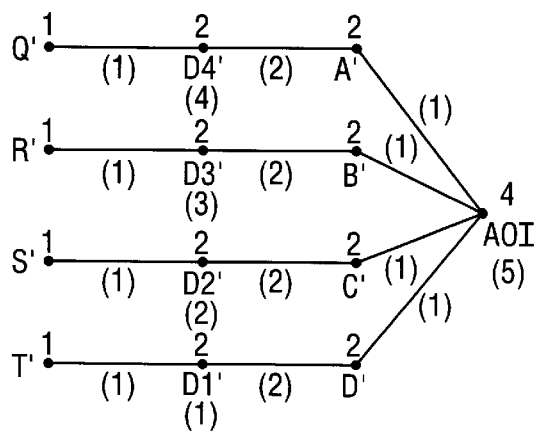
Figure 18B:
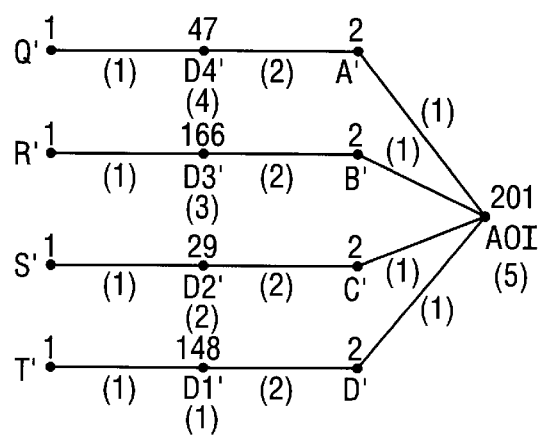
Figure 17C:
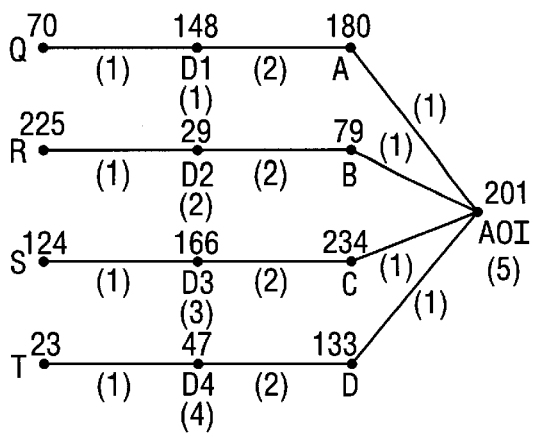
Figure 17D:
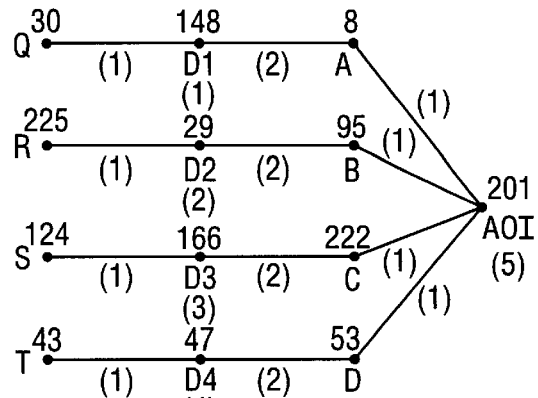
Figure 18C:
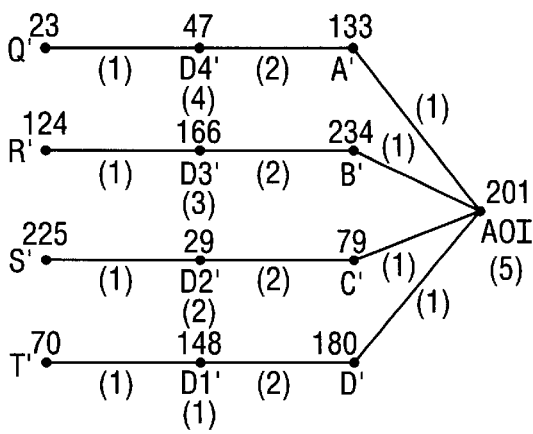
Figure 18D:
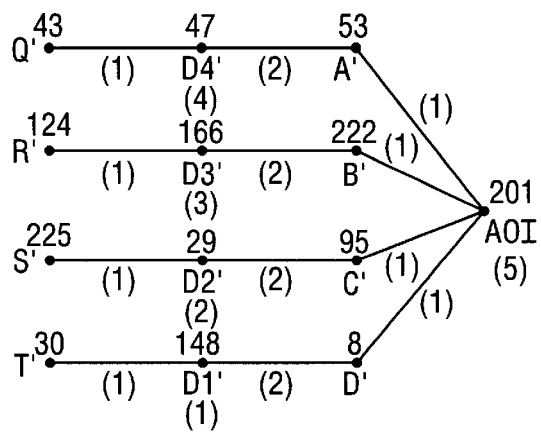

As determined by the inventor herein, the preferred LVS tool may have limited capability to propagate symmetries by inferring symmetries of the parent cell from the symmetries of a child cell therein. An example of a parent cell which exhibits the same symmetries as a child cell therein is illustrated by FIG. 12A. Accordingly, the preferred LVS tool may not be able to take full advantage of the port symmetries of the cell of FIG. 12A when analyzing a schematic and layout containing such symmetric cell. Symmetries may, however, be readily inferred when the symmetric ports of the child cell (e.g., AOI cell) are connected directly to the input ports of the parent cell, with no intervening devices, as illustrated by the parent cell of FIG. 12B. The LVS tool of the present invention takes these latter symmetries into account so that the symmetries of a child cell may be propagated to a parent cell when the LVS tool is evaluating a grandparent cell containing the parent cell.

In addition to the above-described detailed and comprehensive description of the present invention, a general analysis of a simple two-level integrated circuit design is further provided to demonstrate how a conventional method of arbitrarily breaking symmetry in a child cell may result in an erroneous mismatch of the parent cells and how a method of encoding the symmetries of a child cell using the color symmetrizing matrix (CSM) will automatically resolve symmetries in the parent cell. First, a partition function P is generated as:

$$P_{NET}=[\text{node value}+3\Sigma(\text{neighbor node values})+137\Sigma(\text{pin class})]mod256$$

$$P_{DEVICE}=[\text{node value}+3\Sigma(\text{neighbor node values})+137(\text{device class})]mod256$$

These partition functions are chosen to depend on the local structure of the bipartite schematic and layout graphs illustrated by FIGS. 13–14, respectively, and be independent of labeling. The coefficients of "3" and "137" are arbitrary, and are chosen to minimize the likelihood of collisions (i.e., the possibility that different sets of input values might accidentally result in the same function value). The modulus of "256" is used here for convenience, but is preferably selected as large as possible to minimize collisions (typically the largest unsigned integer permitted by the hardware performing the LVS operations). FIGS. 13 and 14 illustrate how the method of symmetry breaking results in a valid mapping from schematic ports to layout ports A→D', B→C', C→B' and D→A'. Node values are shown next to each node. Numbers in parentheses are pin classes when adjacent to an edge, or device classes when adjacent to a device node.

Referring now specifically to FIGS. 13A and 14A, the nodes of the graphs are initialized by assigning node values as equal to the number of adjacent nodes. After the graphs are initialized, a device partition is performed for the schematic and layout graphs, as illustrated by FIGS. 13B and 14B. The node value of 152 for the AND1 and AND2 devices and the node value of 36 for the NOR device are obtained using the device partition function $P_{DEVICE}$:

$$152=[3+3(1+1+2)+137(1)]mod256$$

$$36=[3+3(2+2+1)+137(2)]mod256$$

Following the device partition of FIGS. 13B and 14B, a net partition is performed, as illustrated by FIGS. 13C and 14C. The node value of 82 for the nets A, B, C and D, the node value of 209 for the nets N1 and N2 and the node value of 127 for the net OUT are obtained using the net partition function $P_{NET}$:

$$82=[1+3(152)+137(1)]mod256$$

$$209=[2+3(152+36)+137(2+1)]mod256$$

$$127=[1+3(36)+137(2)]mod256$$

At this point, the symmetries of the bipartite graphs are manifested by the node values, and it is apparent that further partitioning will not resolve symmetries. Because of the symmetry, a guess is made. That is, a matching is arbitrarily imposed between two nodes of the same value, and they are given a new unique (arbitrary) value. In particular, in FIGS. 13D and 14D, a selection is made between AND1 in the schematic and AND2 in the layout and their node values are set to 103. It would also have been acceptable to make the selection between AND2 in the schematic and AND1 in the layout, or any matching among the other nonsingular partitions (i.e., between (A, B, C, D) and (A', B', C', D') or between (N1, N2) and (N1',N2')). Referring now to FIGS. 13E and 14E, another net partition is performed and once again it is apparent that no further partitioning will reduce the symmetry. Finally, in FIGS. 13F and 14F, the remaining matches (i.e., two net assignments) necessary to a complete mapping from schematic to layout are made.

Referring now to FIGS. 3 and 13–16, an illustration is provided on how use of a conventional method of comparing a parent cell schematic with a parent cell layout (that is valid by virtue of the symmetries of the AOI cell) may result in apparent non-equivalence. At the parent level illustrated by FIGS. 15–16, the AOI child cell is represented as a single node with four input ports (the output port has no bearing on the results in this case, and is omitted for simplicity). The input ports of the AOI child cell are differentiated (consistent with the schematic and layout graphs of FIGS. 13E and 14E, respectively) by the assignment of a distinct class to each port, as illustrated. Matching ports in the schematic and layout are assigned the same class. The ports of the AOI are connected to four distinct devices (D1–D4), each of which has a different device class, as illustrated by FIGS. 15A and 16A.

Referring now to FIGS. 15B–15C and FIGS. 16B–16C, a single device partition followed by a single net partition (using the above partition functions) is sufficient to attain unique values for all nodes. The apparent non-equivalence, manifested in FIGS. 15C and 16C by differing node values beween the schematic and layout, is due to the fact that the pin classes (as assigned) do not exhibit the port symmetries of the AOI child cells. As will be understood by those skilled in the art, this is a consequence of an unfortunate choice when an arbitrary match was assigned in FIGS. 13D and 14D.

Figure 3:
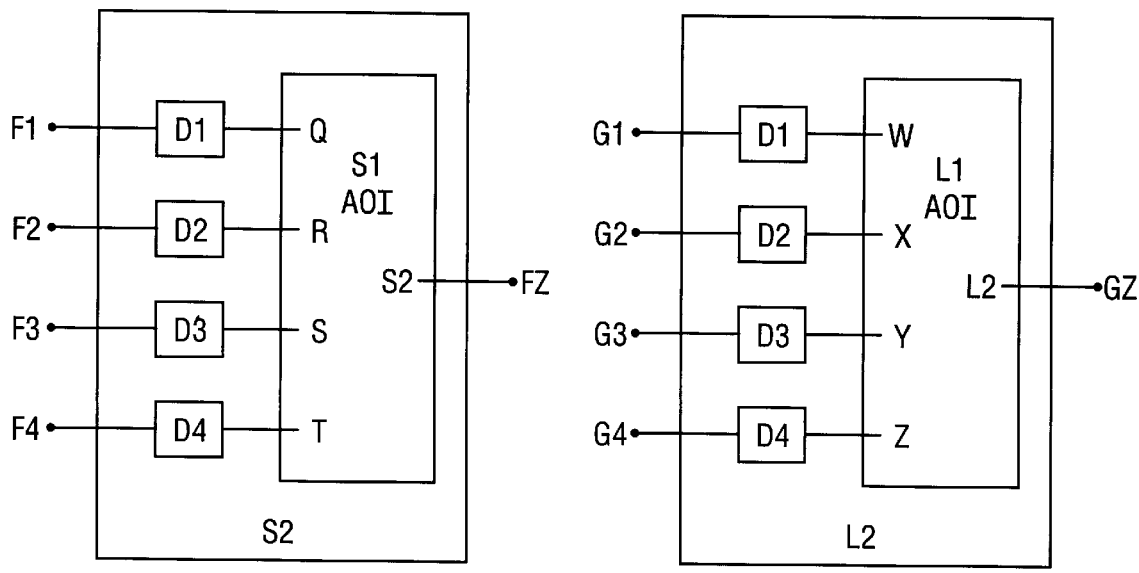
FIG. 3 is an electrical schematic of a parent cell (S2) containing the cell S1 of FIG. 2 and an extracted schematic of a parent cell (L2) containing the cell L1 of FIG. 2.
Figure 4:
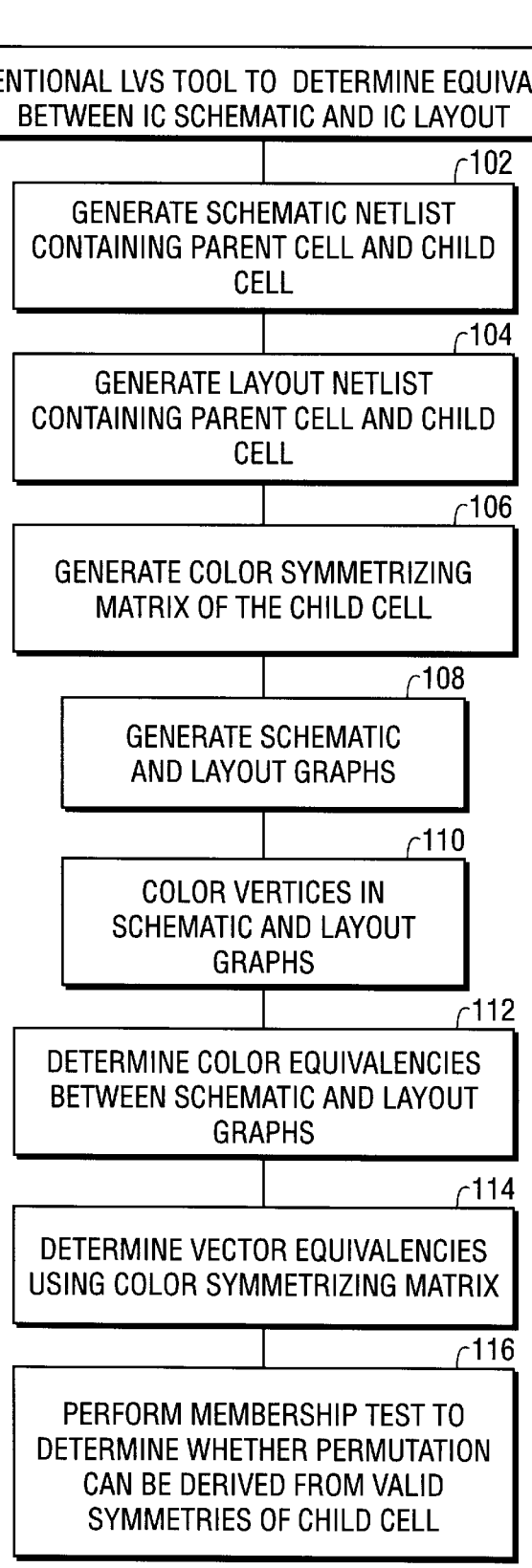
FIG. 4 is a flow diagram of operations performed by a layout versus schematic (LVS) comparison tool according to the prior art.

Referring now to FIGS. 17–19, a graphical illustration of the use of a color symmetrizing matrix (CSM) to resolve symmetries, is provided. In particular, in FIGS. 17A, 18A and 19A, the bipartite graphs corresponding to a schematic of the device of FIG. 3, a correct layout of the device of FIG. 3 and an incorrect layout of the device of FIG. 3, are initialized. However, unlike the graphs of FIGS. 15–16 (where different classes were assigned to each pin), all pins that are related by a symmetry and may be interchanged by some valid permutation (i.e., share the same orbit), are assigned the same class. In the conventional method illustrated by FIGS. 15–16, such assignment could result in forbidden permutations being evaluated as correct. In the method described herein which uses color symmetrizing matrices, the application of the CSM prevents forbidden permutations from being evaluated as correct.

Referring now to FIGS. 17A–17D, a partitioning of the schematic graph of the device of FIG. 3 is provided, with the CSM being applied to the pins of the AOI (which are arranged as a vector) as a final step. In particular, in FIG. 17A the schematic graph is initialized, in FIG. 17B a device partition is performed and in FIG. 17C a net partition is performed. The CSM shown below is then applied to a vector of colors corresponding to the pins of the AOI in FIG. 17C which are arranged from A–D as: [180, 79, 234, 133]. Using a modulus of 256, as described above, a new vector of colors is generated as [8, 95, 222, 53] in FIG. 17D.

$$\begin{bmatrix} 0 & 11 & 13 & 13 \\ 11 & 0 & 13 & 13 \\ 13 & 13 & 0 & 11 \\ 13 & 13 & 11 & 0 \end{bmatrix} \begin{bmatrix} 180 \\ 79 \\ 234 \\ 133 \end{bmatrix} = \begin{bmatrix} 8 \\ 95 \\ 222 \\ 53 \end{bmatrix}$$

Referring now to FIGS. 18A–18D, a partitioning of the correct layout graph is provided, with the CSM being applied to the pins of the AOI (which are arranged as a vector) as a final step. This correct layout graph is equivalent to the schematic by a valid permutation of A→D', B→C', C→B' and D→A'. In particular, in FIG. 18A the correct layout graph is initialized, in FIG. 18B a device partition is performed and in FIG. 18C a net partition is performed. The CSM is then applied to a vector of colors corresponding to the pins of the AOI in FIG. 18C which are arranged from A–D as: [133, 234, 79, 180]. Using a modulus of 256, a new vector of colors is generated as [53, 222, 95, 8] in FIG. 18D. This vector is equivalent to the corresponding vector associated with the schematic graph of FIG. 17D.

$$\begin{bmatrix} 0 & 11 & 13 & 13 \\ 11 & 0 & 13 & 13 \\ 13 & 13 & 0 & 11 \\ 13 & 13 & 11 & 0 \end{bmatrix} \begin{bmatrix} 133 \\ 234 \\ 79 \\ 180 \end{bmatrix} = \begin{bmatrix} 53 \\ 222 \\ 95 \\ 8 \end{bmatrix}$$

Figure 19A:
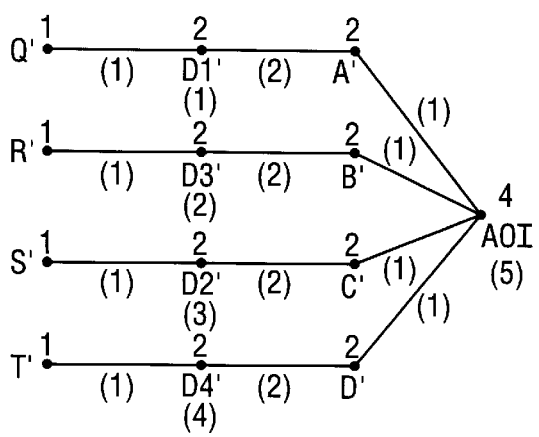
Figure 19B:
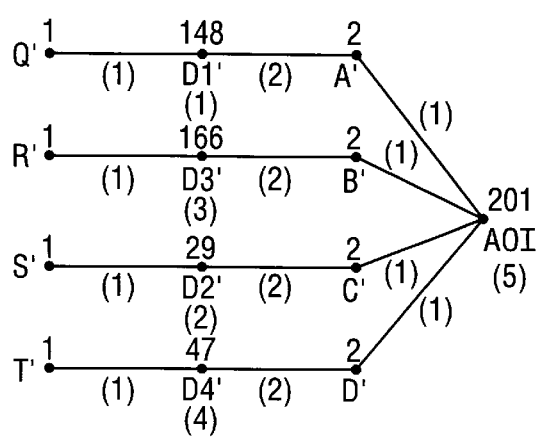
Figure 19C:
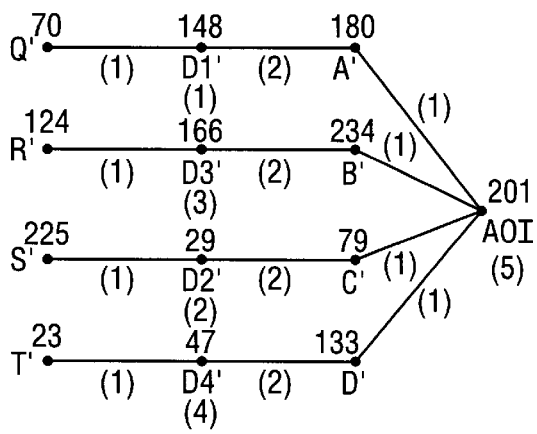
Figure 19D:
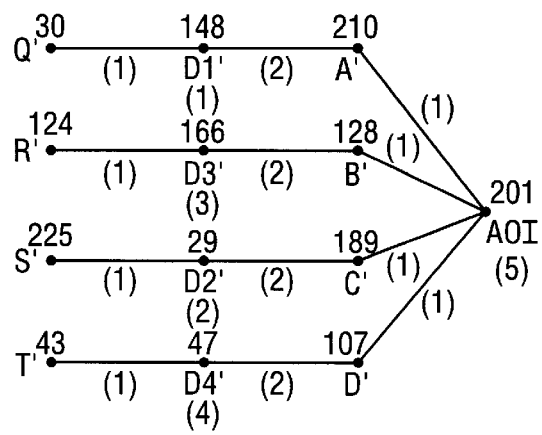

Referring now to FIGS. 19A–19D, a partitioning of the incorrect layout graph is provided, with the CSM being applied to the pins of the AOI (which are arranged as a vector) as a final step. This incorrect layout graph is not equivalent to the schematic because the following invalid permutation of A→A', B→C', C→B' and D→D' was applied. Here, in FIG. 19A the incorrect layout graph is initialized, in FIG. 19B a device partition is performed and in FIG. 19C a net partition is performed. The CSM is then applied to a vector of colors corresponding to the pins of the AOI in FIG. 19C which are arranged from A–D as: [180, 234, 79, 133]. Here, all graphs of FIGS. 17C, 18C and 19C exhibit the same set of node values, so there is no indication that the incorrect layout is incorrect. Yet, by the above CSM and a modulus of 256, a new vector of colors is generated as [210, 128, 189, 107] in FIG. 19D. The resulting vector of FIG. 19D is clearly not equivalent to the corresponding vector associated with the schematic graph of FIG. 17D or the layout graph of FIG. 18D.

$$\begin{bmatrix} 0 & 11 & 13 & 13 \\ 11 & 0 & 13 & 13 \\ 13 & 13 & 0 & 11 \\ 13 & 13 & 11 & 0 \end{bmatrix} \begin{bmatrix} 180 \\ 234 \\ 79 \\ 133 \end{bmatrix} = \begin{bmatrix} 210 \\ 128 \\ 189 \\ 107 \end{bmatrix}$$

Accordingly, after application of the CSM, the correct layout and schematic still share a common set of node values, but the incorrect layout contains node values that do not appear in the schematic. Thus, by setting the classes of the related ports equal, the application of the CSM may distinguish between good and bad permutations.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of determining equivalency between an integrated circuit schematic and an integrated circuit layout, comprising the steps of:

representing the integrated circuit schematic as a hierarchical schematic netlist having a child cell and a parent cell containing the child cell;

extracting the integrated circuit layout as a hierarchical layout netlist having a child cell and a parent cell containing the child cell;

generating a color symmetrizing matrix corresponding to one of the child cells in the hierarchical schematic netlist and the hierarchical layout netlist;

generating a schematic graph of the parent cell in the hierarchical schematic netlist;

generating a layout graph of the parent cell in the hierarchical layout netlist;

coloring the vertices in the schematic graph and generating a first color symmetry vector for the child cell therein;

coloring the vertices in the layout graph and generating a second color symmetry vector for the child cell therein;

determining an equivalency between the colors of the vertices in the schematic graph and the colors of the vertices in the layout graph;

determining a vector equivalency between a product of the color symmetrizing matrix and the first color symmetry vector and a product of the color symmetrizing matrix and the second color symmetry vector; and detecting absence of a spurious symmetry in the color symmetrizing matrix if a vector equivalency is determined.

2. The method of claim 1, wherein said step of determining a vector equivalency comprises determining a vector equivalency if and only if an equivalency between the colors of the vertices in the circuit schematic graph and the colors of the vertices in the layout graph exists.

3. The method of claim 1, wherein said step of generating a color symmetrizing matrix comprises generating a color symmetrizing matrix corresponding to the child cell in the hierarchical schematic netlist.

4. The method of claim 3, wherein said representing step comprises representing the integrated circuit schematic as a hierarchical schematic netlist having a plurality of child cells and a parent cell containing the plurality of child cells; and wherein said extracting step comprises extracting the integrated circuit layout as a hierarchical layout netlist having a plurality of child cells and a parent cell containing the plurality of child cells.

5. The method of claim 4, wherein said step of coloring the vertices in the schematic graph comprises coloring the vertices in the schematic graph and generating a respective first color symmetry vector for each of the child cells in the schematic graph of the parent cell in the hierarchical schematic netlist; and wherein said step of coloring the vertices in the layout graph comprises coloring the vertices in the layout graph and generating a respective second color symmetry vector for each of the child cells in the layout graph of the parent cell in the hierarchical layout netlist.

6. The method of claim 1, wherein said step of detecting absence of a spurious symmetry comprises the steps of:

determining a number of actual symmetries of the color symmetrizing matrix; and determining whether the number of actual symmetries of the color symmetrizing matrix is equivalent to a number of desired symmetries.

7. The method of claim 6, wherein said step of detecting absence of a spurious symmetry comprises performing a membership test if the number of actual symmetries of the color symmetrizing matrix is greater than the number of desired symmetries.

8. The method of claim 7, wherein said step of performing a membership test comprises performing a Schreier-Simms operation if the number of actual symmetries of the color symmetrizing matrix is greater than the number of desired symmetries.

9. The method of claim 1, wherein said step of determining a vector equivalency comprises determining a vector equivalency if and only if an equivalency between the colors of the vertices in the circuit schematic graph and the colors of the vertices in the layout graph exists;

wherein said step of generating a color symmetrizing matrix comprises generating a color symmetrizing matrix corresponding to the child cell in the hierarchical schematic netlist; and wherein said step of detecting absence of a spurious symmetry comprises the steps of determining a number of actual symmetries of the color symmetrizing matrix; and determining whether the number of actual symmetries of the color symmetrizing matrix is equivalent to a number of desired symmetries.

10. The method of claim 9, wherein said step of detecting absence of a spurious symmetry comprises performing a membership test if the number of actual symmetries of the color symmetrizing matrix is greater than the number of desired symmetries.

11. The method of claim 10, wherein said step of performing a membership test comprises performing a Schreier-Simms operation if the number of actual symmetries of the color symmetrizing matrix is greater than the number of desired symmetries.

12. A method of determining equivalency between an integrated circuit schematic and an integrated circuit layout, comprising the steps of:

generating a color symmetrizing matrix corresponding to a child cell in the integrated circuit schematic;

generating a first color symmetry vector for the child cell in the integrated circuit schematic;

generating a second color symmetry vector for a child cell in the integrated circuit layout;

determining a vector equivalency between a product of the color symmetrizing matrix and the first color symmetry vector and a product of the color symmetrizing matrix and the second color symmetry vector; and detecting absence of a spurious symmetry in the color symmetrizing matrix if a vector equivalency is determined.

13. The method of claim 12, wherein said step of detecting absence of a spurious symmetry comprises the steps of:

determining a number of actual symmetries of the color symmetrizing matrix; and determining whether the number of actual symmetries of the color symmetrizing matrix is equivalent to a number of desired symmetries.

14. The method of claim 13, wherein said step of detecting absence of a spurious symmetry comprises performing a membership test if the number of actual symmetries of the color symmetrizing matrix is greater than the number of desired symmetries.

15. The method of claim 14, wherein said step of performing a membership test comprises performing a Schreier-Simms operation if the number of actual symmetries of the color symmetrizing matrix is greater than the number of desired symmetries.

16. A method of determining equivalency between an integrated circuit schematic and an integrated circuit layout, comprising the steps of:

representing the integrated circuit schematic as a hierarchical schematic netlist having a child cell, a parent cell containing the child cell and a grandparent cell containing the parent cell;

extracting the integrated circuit layout as a hierarchical layout netlist having a child cell, a parent cell containing the child cell and a grandparent cell containing the parent cell;

propagating a symmetry of the child cell to the parent cell in the hierarchical schematic netlist;

generating a color symmetrizing matrix corresponding to the parent cell in the hierarchical schematic netlist;

generating a schematic graph of the grandparent cell in the hierarchical schematic netlist;

generating a layout graph of the grandparent cell in the hierarchical layout netlist;

coloring the vertices in the schematic graph and generating a first color symmetry vector for the parent cell therein;

coloring the vertices in the layout graph and generating a second color symmetry vector for the parent cell therein;

determining an equivalency between the colors of the vertices in the schematic graph and the colors of the vertices in the layout graph; and determining a vector equivalency between a product of the color symmetrizing matrix and the first color symmetry vector and a product of the color symmetrizing matrix and the second color symmetry vector.

17. The method of claim 16, further comprising the step of detecting absence of a spurious symmetry in the color symmetrizing matrix if a vector equivalency is determined.

18. The method of claim 17, wherein said step of detecting absence of a spurious symmetry comprises the steps of:

determining a number of actual symmetries of the color symmetrizing matrix; and determining whether the number of actual symmetries of the color symmetrizing matrix is equivalent to a number of desired symmetries.

19. The method of claim 18, wherein said step of detecting absence of a spurious symmetry comprises performing a membership test if the number of actual symmetries of the color symmetrizing matrix is greater than the number of desired symmetries.

20. The method of claim 19, wherein said step of performing a membership test comprises performing a Schreier-Simms operation if the number of actual symmetries of the color symmetrizing matrix is greater than the number of desired symmetries.

21. A computer program product for determining equivalency between an integrated circuit schematic and an integrated circuit layout, comprising a computer readable storage medium having computer-readable program code means embodied in said medium, said computer-readable program code means comprising:

computer-readable program code means for representing the integrated circuit schematic as a hierarchical schematic netlist having a child cell and a parent cell containing the child cell;

computer-readable program code means for extracting the integrated circuit layout as a hierarchical layout netlist having a child cell and a parent cell containing the child cell;

computer-readable program code means for generating a color symmetrizing matrix corresponding to one of the child cells in the hierarchical schematic netlist and the hierarchical layout netlist;

computer-readable program code means for generating a schematic graph of the parent cell in the hierarchical schematic netlist;

computer-readable program code means for generating a layout graph of the parent cell in the hierarchical layout netlist;

computer-readable program code means for coloring the vertices in the schematic graph and generating a first color symmetry vector for the child cell therein;

computer-readable program code means for coloring the vertices in the layout graph and generating a second color symmetry vector for the child cell therein;

computer-readable program code means for determining an equivalency between the colors of the vertices in the schematic graph and the colors of the vertices in the layout graph;

computer-readable program code means for determining a vector equivalency between a product of the color symmetrizing matrix and the first color symmetry vector and a product of the color symmetrizing matrix and the second color symmetry vector; and computer-readable program code means detecting absence of a spurious symmetry in the color symmetrizing matrix if a vector equivalency is determined.

22. The computer program product of claim 21, wherein said computer-program product code means for determining a vector equivalency comprises computer-program product code means for determining a vector equivalency if and only if an equivalency between the colors of the vertices in the circuit schematic graph and the colors of the vertices in the layout graph exists.

23. The computer program product of claim 21, wherein said computer-program product code means for detecting absence of a spurious symmetry comprises computer-program product code means for determining a number of actual symmetries of the color symmetrizing matrix and determining whether the number of actual symmetries of the color symmetrizing matrix is equivalent to a number of desired symmetries.

24. The computer program product of claim 23, wherein said computer-program product code means for detecting absence of a spurious symmetry comprises computer-program product code means for performing a membership test if the number of actual symmetries of the color symmetrizing matrix is greater than the number of desired symmetries.

25. The computer program product of claim 24, wherein said computer-program product code means for performing a membership test comprises computer-program product code means for performing a Schreier-Simms operation if the number of actual symmetries of the color symmetrizing matrix is greater than the number of desired symmetries.

26. An apparatus for determining equivalency between an integrated circuit schematic and an integrated circuit layout, comprising:

means for generating a color symmetrizing matrix corresponding to a child cell in the integrated circuit schematic;

means for generating a first color symmetry vector for the child cell in the integrated circuit schematic;

means for generating a second color symmetry vector for a child cell in the integrated circuit layout;

means for determining a vector equivalency between a product of the color symmetrizing matrix and the first color symmetry vector and a product of the color symmetrizing matrix and the second color symmetry vector; and means for detecting absence of a spurious symmetry in the color symmetrizing matrix if a vector equivalency is determined.

27. The apparatus of claim 26, wherein said means for detecting absence of a spurious symmetry comprises means for determining a number of actual symmetries of the color symmetrizing matrix and determining whether the number of actual symmetries of the color symmetrizing matrix is equivalent to a number of desired symmetries.

28. The apparatus of claim 27, wherein said means for detecting absence of a spurious symmetry comprises means for performing a membership test if the number of actual symmetries of the color symmetrizing matrix is greater than the number of desired symmetries.

29. The apparatus of claim 28, wherein said means for performing a membership test comprises means for performing a Schreier-Simms operation if the number of actual symmetries of the color symmetrizing matrix is greater than the number of desired symmetries.

30. A computer program product for determining equivalency between an integrated circuit schematic and an integrated circuit layout, comprising a computer-readable storage medium having computer-readable program code embodied in said medium, said computer-readable program code comprising:

computer-readable program code that generates a color symmetrizing matrix corresponding to a child cell in the integrated circuit schematic;

computer-readable program code that determines a vector equivalency between a product of the color symmetrizing matrix and a first color symmetry vector for the child cell in the integrated circuit schematic and a product of the color symmetrizing matrix and a second color symmetry vector for a child cell in the integrated circuit layout; and computer-readable program code that detects absence of a spurious symmetry in the color symmetrizing matrix if a vector equivalency is determined.

31. The computer program product of claim 30, wherein said computer-readable program code that detects absence of a spurious symmetry comprises:

computer-readable program code that determines a number of actual symmetries of the color symmetrizing matrix; and computer-readable program code that determines whether the number of actual symmetries of the color symmetrizing matrix is equivalent to a number of desired symmetries.

32. The computer program product of claim 31, wherein said computer-readable program code that detects absence of a spurious symmetry comprises:

computer-readable program code that performs a membership test if the number of actual symmetries of the color symmetrizing matrix is greater than the number of desired symmetries.

33. The computer program product of claim 32, wherein said computer-readable program code that performs a membership test comprises computer-readable program code that performs a Schreier-Simms operation if the number of actual symmetries of the color symmetrizing matrix is greater than the number of desired symmetries.

* * * * *